United States Patent
Shibazaki

(10) Patent No.: US 8,253,929 B2
(45) Date of Patent: Aug. 28, 2012

(54) STAGE APPARATUS, FIXATION METHOD, EXPOSURE APPARATUS, EXPOSURE METHOD, AND DEVICE-PRODUCING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 243 days.

(21) Appl. No.: 12/153,772

(22) Filed: May 23, 2008

(65) Prior Publication Data

US 2008/0239276 A1 Oct. 2, 2008

Related U.S. Application Data

(60) Division of application No. 11/290,573, filed on Dec. 1, 2005, now Pat. No. 7,394,526, which is a continuation of application No. PCT/JP2004/008063, filed on Jun. 3, 2004.

(30) Foreign Application Priority Data

Jun. 4, 2003 (JP) ................................ 2003-159800

(51) Int. Cl.
*G03B 27/32* (2006.01)
*G03B 27/58* (2006.01)
*G03B 27/62* (2006.01)

(52) U.S. Cl. ................. 355/77; 355/72; 355/75

(58) Field of Classification Search .............. 355/53, 355/72–76, 77; 361/234; 310/10, 12; 318/649
See application file for complete search history.

(56) References Cited

U.S. PATENT DOCUMENTS

| | | | | |
|---|---|---|---|---|
| 4,711,438 A | * | 12/1987 | Guarino | 269/152 |
| 4,924,258 A | * | 5/1990 | Tsutsui | 355/53 |
| 5,854,819 A | * | 12/1998 | Hara et al. | 378/34 |
| 6,172,738 B1 | | 1/2001 | Korenaga et al. | |
| 6,281,654 B1 | | 8/2001 | Lee | |
| 6,683,433 B2 | | 1/2004 | Lee | |
| 6,806,943 B2 | * | 10/2004 | Barringer et al. | 355/75 |
| 6,885,435 B2 | | 4/2005 | Galburt | |
| 6,888,621 B2 | | 5/2005 | Araki et al. | |
| 2002/0118346 A1 | | 8/2002 | Galburt et al. | |

FOREIGN PATENT DOCUMENTS

| | | |
|---|---|---|
| JP | A 04-220648 | 8/1992 |
| JP | A-4-220648 | 8/1992 |
| JP | A 07-011287 | 2/1995 |
| JP | A 08-166475 | 6/1996 |
| JP | A 08-330224 | 12/1996 |
| JP | A-9-148395 | 6/1997 |
| JP | A 09-148406 | 6/1997 |
| JP | A-9-148406 | 6/1997 |
| JP | A 10-149979 | 6/1998 |

(Continued)

OTHER PUBLICATIONS

Japanese Office Action with English-language Translation issued in Japanese Patent Application No. 2005-506831 and mailed on Sep. 29, 2009.

(Continued)

*Primary Examiner* — Hung Henry Nguyen

(74) *Attorney, Agent, or Firm* — Oliff & Berridge, PLC

(57) ABSTRACT

A stage apparatus including: a movement member movable with a plate member placed on a placement surface; and a fixing apparatus that fixes said plate member to said placement surface in parallel with said movement member passing through a prescribed first region.

12 Claims, 15 Drawing Sheets

FOREIGN PATENT DOCUMENTS

| | | |
|---|---|---|
| JP | A-10-189700 | 7/1998 |
| JP | A 10-189700 | 7/1998 |
| JP | A 11-040657 | 2/1999 |
| JP | A-11-40657 | 2/1999 |
| JP | A 2002-343850 | 11/2002 |
| JP | A 2004-328014 | 11/2004 |
| TW | 405161 | 9/2000 |

OTHER PUBLICATIONS

Jan. 4, 2011 Office Action in Japanese Application No. 2005-506831, with translation.

Jan. 7, 2011 Office Action in Korean Application No. 2005-7021091, with translation.

Jul. 19, 2007 Office Action issued in U.S. Appl. No. 11/290,573.

Feb. 25, 2008 Notice of Allowance issued in U.S. Appl. No. 11/290,573.

Sep. 10, 2004 International Search Report for PCT/JP2004/008063 (with English translation).

Sep. 30, 2004 Written Opinion of the International Search Authority for PCT/JP2004/008063 (with English translation).

Feb. 16, 2010 Office Action issued in Japanese Patent Application No. 2005-506831 (with translation).

Jul. 13, 2010 Office Action issued in Japanese Patent Application No. 2005-506831 (with translation).

Sep. 6, 2011 Office Action in Japanese Patent Application No. 2005-506831 (with English translation).

Jan. 4, 2011 Office Action issued in Japanese Application No. 2005-506831 with English Translation.

Apr. 20, 2010 Office Action in Taiwanese Patent Application No. 093115908 (with English translation).

Japanese Patent Office, Appeal Decision, Appeal No. 2011-7003 mailed May 29, 2012 in Application No. 2005-506831 w/English-language Translation.

\* cited by examiner

STAGE APPARATUS, FIXATION METHOD, EXPOSURE APPARATUS, EXPOSURE METHOD, AND DEVICE-PRODUCING METHOD

This is a Division of application Ser. No. 11/290,573 filed Dec. 1, 2005, which is a Continuation Application of International Application No. PCT/JP2004/008063, filed Jun. 3, 2004, which claims priority to Japanese Patent Application No. 2003-159800, filed Jun. 4, 2003. The contents of the aforementioned applications are incorporated herein by reference in their entirety.

BACKGROUND OF THE INVENTION

1. Field of the Invention

The present invention relates to a stage apparatus that moves precisely in one dimension or two dimensions over a flat table onto which is placed a mask or substrate onto which a pattern is described, and to an exposure apparatus or the like using such a stage apparatus.

2. Description of Related Art

In the past, in a microlithography apparatus in which a circuit pattern of a semiconductor device or a liquid-crystal device is formed by shining illumination light (an energy beam such as an ultraviolet beam, an X-ray beam, or an electron beam or the like) onto a mask or the like on which a circuit pattern is described so as to perform exposure of a sensitized substrate (a semiconductor wafer or glass plate or the like onto which a resist layer has been applied) by projection through a projection image forming system that is full-size or that has a reduction or magnification ratio, a stage apparatus is provided, onto which the mask or sensitized substrate is placed, and which moves in one dimension or in two dimensions within a plane (XY plane), under position servocontrol by a laser interferometer.

In such a stage apparatus, the mask or substrate is generally vacuum chucked by a vacuum chucking force. In particular, because the surface area that is held by the vacuum chucking is small and scanning is done at a speed that is approximately 4 or 5 times that of the wafer, there is a tendency for the mask holding force to be insufficient, so that the mask position shifts during the scanning of the mask stage. For this reason, there is a technology, as shown in Japanese Unexamined Patent Application, First Publication No. H10-149979, of pressing a member serving as a positioning reference up against the mask, so as to prevent offset.

In recent years, in order to improve the productivity of exposure apparatuses, there is a desire to increase the speed of the reticle stage apparatus or wafer stage, so that the acceleration to which the wafer is subjected reaches 5 to 6 G.

In the above-described technology, however, because the force that holds the mask is only the vacuum chucking force that acts on the bottom surface of the mask, if the stage apparatus is moved with a high acceleration, there is the problem of insufficient holding force, resulting in mask offset and a deterioration of the transfer precision.

SUMMARY OF THE INVENTION

The present invention was made in consideration of the above-noted situation, and has as object to provide a stage apparatus that, by holding a mask or the like with a strong force, has no danger of position offset, and an exposure apparatus that uses same. To make the description of the present invention easier to understand, the description is presented with reference to reference numerals applied to drawings of embodiments. However, the present invention is not restricted to those embodiments.

A first aspect of the present invention is a stage apparatus includes: a movement member movable with a plate member placed on a placement surface; and a fixing apparatus that fixes the plate member to the placement surface in parallel with the movement member passing through a prescribed first region.

In accordance with an embodiment of the invention, it is possible for the fixing apparatus to be driven so as to fix the plate member automatically by the stage apparatus merely passing through a prescribed region.

In the embodiment of the invention, the movement member can pass through the first region after moving from a second region in which the plate member is placed on the movement member, and the fixing apparatus can fix the plate member to the placement surface in parallel with the movement member from the second region passing through the first region. By doing this, the stage apparatus onto which the plate member is placed on the movement member simply passing through the first region after moving from the second region, so that the fixing apparatus is driven so as to fix the plate member automatically.

In the embodiment of the invention, the movement member can pass through the first region during moving toward a third region in which the plate member is removed from the movement member, and the fixing apparatus can release fixing of the plate member in parallel with the movement member from the third region passing through the first region. By doing this, the stage in which the plate member is placed on the movement member simply moves through the first region and moves to the third region, so that the fixing apparatus is driven so as to release the fixation of the plate member.

Additionally, in the case in which the second region and the third region are one and the same region, the region in which the plate member is placed on the movement member and the region in which the plate member is removed from the movement member are one and the same region, making it possible to suppress an excessive increase in the size of the apparatus.

Also, if the direction of movement when the movement member passes through the first region when the fixing apparatus fixes the plate member and the direction of movement when movement member passes through the first region when the fixing apparatus releases the fixation are mutually inconsistent, it is possible to make a clear distinction between the region in which the plate member is fixed and the region in which the fixing of the plate member is released, surrounding the first region.

Also, if a conversion apparatus that converts the movement of the movement member to motive force of the fixing apparatus by coming into contact with part of the movement member when the movement member passes through the first region, it is possible to cause the driving of the fixing member without using a special actuator.

In the embodiment of the invention, the conversion apparatus can be a cam apparatus having a cam follower provided on the fixing apparatus and a cam member provided on a base part that supports the movement member. By doing this, it is possible by the cam apparatus to convert movement of the stage apparatus to motive force of the fixing apparatus easily and reliably.

Also, if the cam follower is provided with a bearing that reduces the friction with the cam member, it is possible to make the operation of the fixing apparatus smooth, and also to extend the life of the apparatus.

Also, if the cam member is provided with a shock-absorber which reduces the resistance when contact is made with the cam follower, it is possible to make the operation of the fixing apparatus smooth, and also to extend the life of the apparatus.

Also, if a pull-back apparatus that causes the cam follower to pull-back from the movement paths of the movement member, it is possible by causing the cam member to pull-back from the movement path to stop the drive of the fixing apparatus.

In the embodiment of the invention, a cam apparatus can be provided that turns movement of the movement member into motive force of the fixing apparatus by mechanical contact with a part of the movement member when the movement member passes through the first region, at least part of the cam apparatus disposed in the second region. Because the cam apparatus is disposed in the second region, there is no contact between the fixing apparatus and the cam apparatus in other regions, enabling the achievement of precise movement by the stage apparatus.

If the fixing apparatus has a holding apparatus that holds fixing of the plate member, it is possible to hold (maintain) the fixing of the plate member even in the case in which the fixing apparatus and cam apparatus are not in contact.

Also, if the fixing apparatus is provided with a springy body at a part contacting with the plate member, it is possible to avoid damage to the plate member by the fixing apparatus.

In the embodiment of the invention, a second movement member can be provided so as to move in a direction that is opposite from the direction of movement of the movement member in accordance with the weight ratio with the movement member, by the reaction force generated when the movement member is driven, and the weight of the movement member can include at least part of the weight of the fixing apparatus. By doing this, the above-noted repelling force can be cancelled out or relaxed by the movement of the second movement member. For this reason, it is possible to suppress vibration of the stage apparatus. Also, if the above-noted repelling force is cancelled out, it is further possible to prevent a shift in the center of gravity of the stage apparatus.

A second aspect of the present invention is a method of fixing a plate member to the movement member of the stage apparatus, whereby the movement member performs fixing of the plate member so as to pass through a prescribed first region provided within the stage apparatus.

By doing this, by the stage apparatus merely passing through a prescribed region, it is possible to fix the plate member by drive of the fixing apparatus automatically, without providing a special drive apparatus.

Additionally, by passing through the first region after the movement member passes from the second region in which the plate member is placed on the movement member so that the fixing apparatus fixes the plate member, the stage apparatus onto which the plate member is placed on the movement member simply passing through the first region after moving from the second region drives the fixing apparatus so as to fix the plate member automatically.

Also, during the movement of the movement member towards the third region in which the plate member is removed from the movement member it passes through the first region so that the fixing apparatus releases the fixing of the plate member, by the stage apparatus in which the plate member is placed onto the movement member simply moving to the third region after passing through the first region can release the fixing of the plate member automatically by drive of the fixing apparatus.

Additionally, in the case in which the second region and the third region are one and the same region, the region in which the plate member is placed on the movement member and the region in which the plate member is removed from the movement member are one and the same region, making it possible to suppress an excessive increase in the size of the apparatus.

A third aspect of the present invention is an exposure apparatus having a mask stage that holds a mask and a substrate stage that holds a substrate, in which a substrate is exposed with a pattern formed on the mask, wherein a stage apparatus according to the first aspect of the present invention is used for at least one of the mask stage and substrate stage.

By the above, because the fixing apparatus holds the mask or substrate with firm pressure, even if the stage is moved at high speed during exposure, it is possible to transfer a highly precise pattern onto the substrate without shifting of the mask or substrate.

A fourth aspect of the present invention is an exposure method whereby the mask is fixed to a mask stage, the substrate is fixed to a substrate stage, and the substrate is exposed, in which the fixing method according to the second aspect of the present invention is used for at least one of the mask fixing method and the substrate fixing method.

By the above, because the mask or substrate is held by firm pressure, even if the stage is quickly accelerated or decelerated during exposure processing, it is possible to transfer a highly precise pattern onto the substrate without shifting of the mask or substrate.

A fifth aspect of the present invention is method of producing a device that include a lithography process step, in which the exposure apparatus according to the third aspect of the present invention is used in the lithography step. In the method for producing a device that includes a lithography process step, the exposure method according to the fourth aspect of the present invention was used.

By the above, it is possible to produce a device onto which a highly precise pattern is transferred.

According to a stage apparatus of the first aspect of the present invention, it is possible to automatically drive a fixing apparatus by merely the stage apparatus passing through a prescribed region, without providing a special drive apparatus.

According to a fixation method of the second aspect of the present invention, it is possible to automatically drive a fixing apparatus my merely the stage apparatus passes through a prescribed region, without providing a special drive apparatus.

According to an exposure apparatus of the third aspect of the present invention, because a fixing apparatus fixes a mask or substrate by pressure holding, even if the stage is moved at high speed during exposure processing, the mask or substrate does not shift, making it possible to transfer a precise pattern to the mask.

According to an exposure apparatus of the fourth aspect of the present invention, because a mask or substrate is held firmly by pressure holding, even if the stage is moved at high speed during exposure processing, the mask or substrate does not shift, making it possible to transfer a precise pattern to the mask.

According to a method for manufacturing a device of the fifth aspect of the present invention, it is possible to manufacture a device with a highly precise transferred pattern.

DETAILED DESCRIPTION OF THE INVENTION

A first embodiment of a stage apparatus and the like of the present invention is described below, with references being made to FIGS. 1 to 6.

Figure 1:
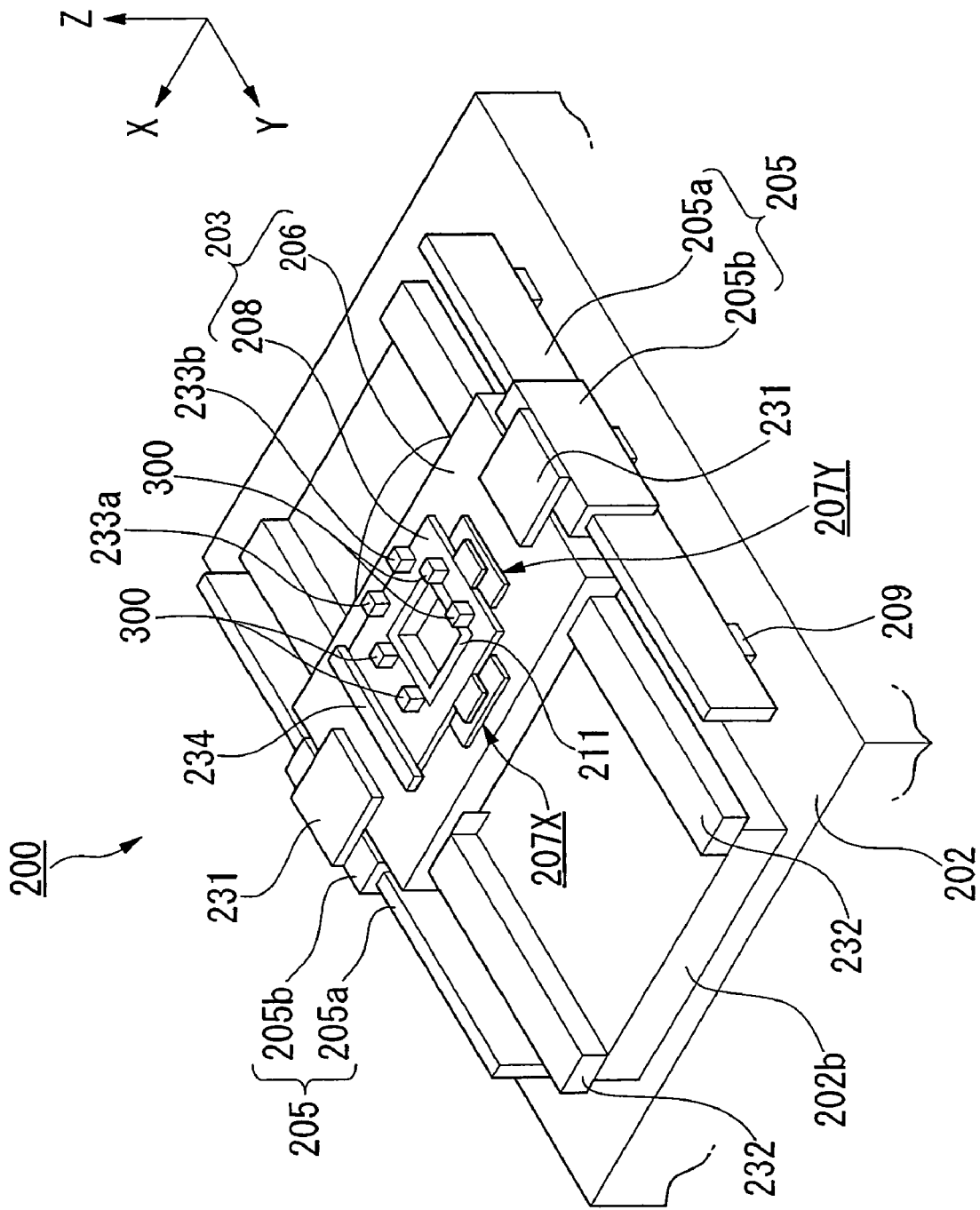
FIG. 1 is an oblique view showing a reticle stage apparatus of a first embodiment.

FIG. 1 is an oblique view showing the reticle stage apparatus 200 of the present invention.

The reticle stage apparatus (stage apparatus) 200 holds the reticle (plate member, mask) with the pattern (PA) surface downward, moves in a one-dimensional scan in the Y direction, and also makes fine movements in the X direction and in the rotational direction ($\theta_Z$ direction).

The reticle stage apparatus 200 has a stage part 203, which is driven through a prescribed stroke in the Y direction over the reticle table (base part) that is held by a column 201.

The stage part (movement member) 203 has a reticle coarse movement stage 206, which is driven in the Y direction by a pair of Y linear motors 205, and a reticle fine movement stage 208 that is finely driven in the X, Y, and $\theta_Z$ directions over the reticle coarse movement stage 206 by a pair of X voice coil motors 207X and a pair of Y voice coil motors 207Y.

Each of the Y linear motors 205 is provided with a stator (second movement member) 205a extending in the Y direction and supported in a floating manner by a plurality of air bearings (air pads) 209, and an stator (second movement member) 205b, provided in correspondence to the stator 205a, and which is fixed to the reticle coarse movement stage 206 via a linking member 231. For this reason, by the law of preservation of motion, in response to the +Y-direction movement of the reticle coarse movement stage 206, the stator 205a moves in the –Y-direction. By the movement of this stator 205a, the repelling force accompanying the movement of the reticle coarse movement stage 206 is cancelled out, and it is possible to prevent a change in the center of gravity.

The reticle coarse movement stage 206 is such that it is guided by a pair of Y guides 232, which are fixed to the upper surface of an upper protruding part formed at the center part of the reticle table 202 and which extend in the Y direction. The reticle coarse movement stage 206 is supported in a non-contacting manner on the Y guides 232 by air bearings, which are not illustrated.

The reticle fine movement stage 208 has an aperture that opposes the pattern PA of the reticle R, the reticle R being supported by vacuum chucking with the pattern downward, via the reticle holder (placement surface) 211, which is planar and disposed around the periphery of the aperture. Four reticle clamps 300 are disposed on the ends of the X-direction ends of the reticle holder 211 (two at each end).

The reticle clamps 300 for mechanically holding the reticle R by pressing from above, for the purpose of supplementing the insufficiency in the vacuuming chucking force on the reticle R by the reticle holder 211. The reason that the reticle clamps 300 are disposed at each of the X-direction ends of the reticle holder 211 is to avoid interference with the reticle R, which is placed on the reticle holder 211 and transported in the Y direction. Therefore, as long as there it would not hinder the transport of the reticle R, the reticle clamps 300 can alternatively be disposed at the Y-direction ends of the reticle R. The number of reticle clamps 300 to provide can be decided in accordance with the amount of pressing force required to hold the reticle R. However, to prevent distortion of the reticle R by the pressing force, it is desirable that they be disposed uniformly with respect to the reticle R (for example, at the four corners).

A pair of Y-direction moving mirrors 233a, 233b formed by corner cubes, is fixed at the –Y-direction end of the reticle fine movement stage 208, and an X-direction moving mirror 234 formed by a planar mirror extending in the X direction is fixed at the +X-direction end of the reticle fine movement stage 208. Three laser interferometers 235a to 235c (refer to FIG. 3) provided at the outer part with respect to these moving mirrors 233a, 233b, and 234 measure the distance to each mirror, so as to measure the X, Y, and $\theta_Z$ (rotational direction) positions with high accuracy. Also, the position measurement information of the reticle fine movement stage 208 (that is, the position information of the reticle R) is sent to the main control system 70.

Figure 2A:
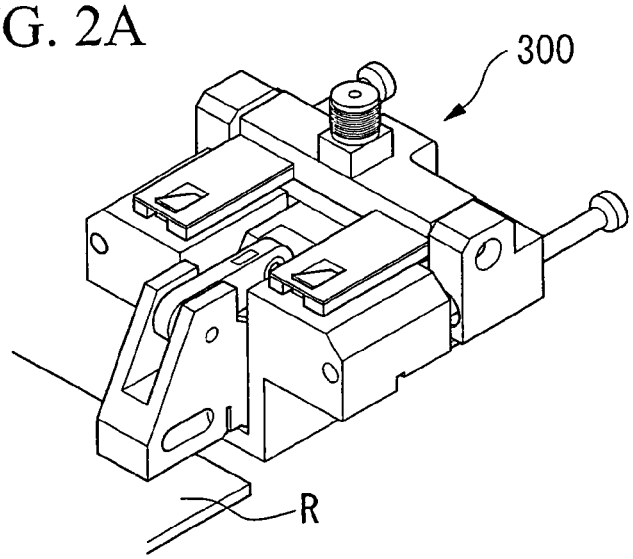
FIGS. 2A and 2B are oblique views showing a reticle clamp of the first embodiment.
Figure 2B:
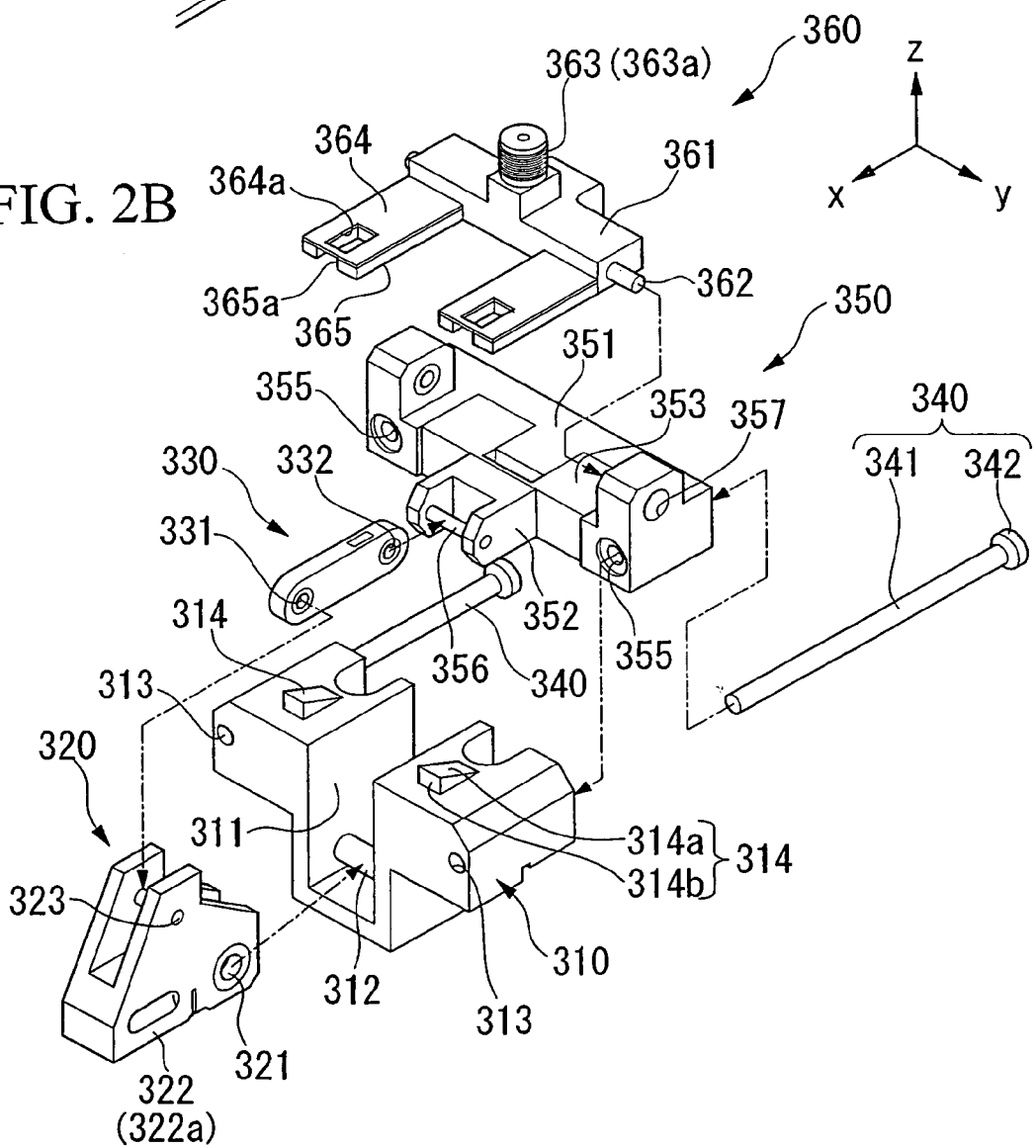

Next, the configuration of the reticle clamps (fixing apparatuses) 300 is described below in detail. FIG. 2A is an oblique view showing the reticle clamp 300, this showing the condition in which the reticle R held by pressing. FIG. 2B is an exploded oblique view of the reticle clamp 300.

As shown in FIG. 2B, the reticle clamp 300 is formed by a base part 310, a pad part 320, a link part 330, sliding guide parts 340, a clamping spring part 350, and a follower part 360.

The base part 310 is provided at both X-direction ends of the reticle holder 211. A pin 312 is provided in a channel part 311, which is formed in substantially a channel shape along the X direction. The pad part 320 is held in the channel part 311, and there is mating of the pin 312 with the pin hole 321 of the pad part 320, as described later, so that the pad part 320 is rotatably supported.

To both sides of the base part 310 are provided guide insertion holes 313 along the X direction for the purpose of inserting the sliding and fixing the guide parts 340. Therefore, when the sliding guide parts 340 are inserted into the guide insertion holes 313, the two sliding guide parts 340 are fixed in the condition of extending in the X direction. Also, the sliding guide parts 340 are formed by rod members 341, onto one end of which is provided a stopper part 342 formed with a diameter that is larger than that of the rod member 341.

Two finger parts 314 are formed on the upper surfaces of the base part 310. The finger parts 314 are formed so as to be substantially triangular viewed from the side, having an inclined surface 314a which increases in height moving towards the reticle R in the X direction, and a surface 314b, which is substantially perpendicular to the reticle R.

The pad part 320 is made of a substantially triangular member, on one vertex of which (the linear motor side) is formed a pin hole 321. As described above, the pin hole 321 mates with the pin 312 of the base part 310, and is housed within the channel part 311 of the base part 310, being rotatably supported. Therefore, the pad part 320 is disposed substantially perpendicularly with respect to the X-direction end surface of the reticle R.

A contacting part 322 which makes contact with the reticle R placed on the reticle holder 211 is provided on the lower surface of the pad part 320. The contacting part 322 is made of a springy body 322a, so that it does not damage the reticle R which it contacts. In addition to sponge and rubber, it is possible to use a spring or springy hinge mechanism as the springy body 322a. It is desirable to make the width of the contacting part 322 being such that it does not interfere with the channel part and the like of the base part 310, thereby making the surface area of contact with the reticle R large, and pressing on the reticle R uniform.

The other vertex part at the top is formed so as to be bifurcated in the X direction, with pin 323 formed in a part thereof.

The link part 330 formed by a straight member has pin hole parts 331 and 332 at each end, the pin hole 331 mating with the above-described pin 323 of the pad part 320, so as to provide support in a rotatable manner. Additionally, the other pin hole 332 mates with the pin 356 of the clamping spring part 350, so as to provide rotatable support thereto.

The clamping spring part 350 is formed by a body part 351, a linking part 352 and a spring part 353, and has a structure such that the body part 351 and the linking part 352 are linked via the spring part 353.

The body part 351 has two holes 355 that mate with the sliding guide parts 340, so that by the mating of the two sliding guide parts 340 fixed to the base part 310 with these holes 355, the slide guide parts 340 are movably supported in the X direction along the slide guide parts 340. Holes 357, which mate with the follower part 360, are provided at the upper part of the body part 351.

The linking part 352 is formed as a channel, having a pin therewithin which mates with the pin hole 332 of the link part 330.

The spring part 353 is configured by a springy hinge mechanism that is machined using electric discharge machining using the wire-cut method, and supports the link part 353 so as to enable its movement in the X direction relative to the body part 351. By the resilience of the spring part 353 force is applied that holds the reticle R. Therefore, by adjusting the spring constant of the spring part 353, it is possible to adjust the pressing force of the reticle clamp 300. The spring part 353 is not restricted to being a springy hinge mechanism, but can also be a coil spring or leaf spring or the like having resilience.

The follower part 360 is formed by a body part 361, pins 352 provided at both ends of the body part 361, a cam follower 363 provide at the upper part of the body part 361, a leaf spring 364 extending from the body part 361 in the direction of the reticle R, and two support plates 365, which are disposed so as to overlap the leaf springs 364 at the bottom surface side and so as to restrict the deformation of the leaf springs 364 in the downward direction.

The follower part 360, by the pins 362 provided at both ends of the body part 361 mating with the holes 357 of the clamping spring part 350, rotatably supports the clamping spring part 350. Also, by the contact between the body part 361 of the follower part 360 and the body part 351 of the clamping spring part 350, restriction so as to not rotate above a prescribed amount is achieved. Specifically, the leaf springs 364 are prevented from rotating downward from the horizontal position (refer to FIG. 5 and FIG. 6).

A rectangular hole 364a that mates with the finger parts 314 of the base part 310 is provided in the end of each of the two leaf springs (holding apparatuses) 364. A channel-shaped cutout part 365a is provided at the end parts of the two support plates 365, in parts that are opposite the holes 364a of the leaf springs 364.

A bearing 363a for the purpose of alleviating friction of contact with the cam member 400, which is described below, is provided on the cam follower 363.

Figure 3:
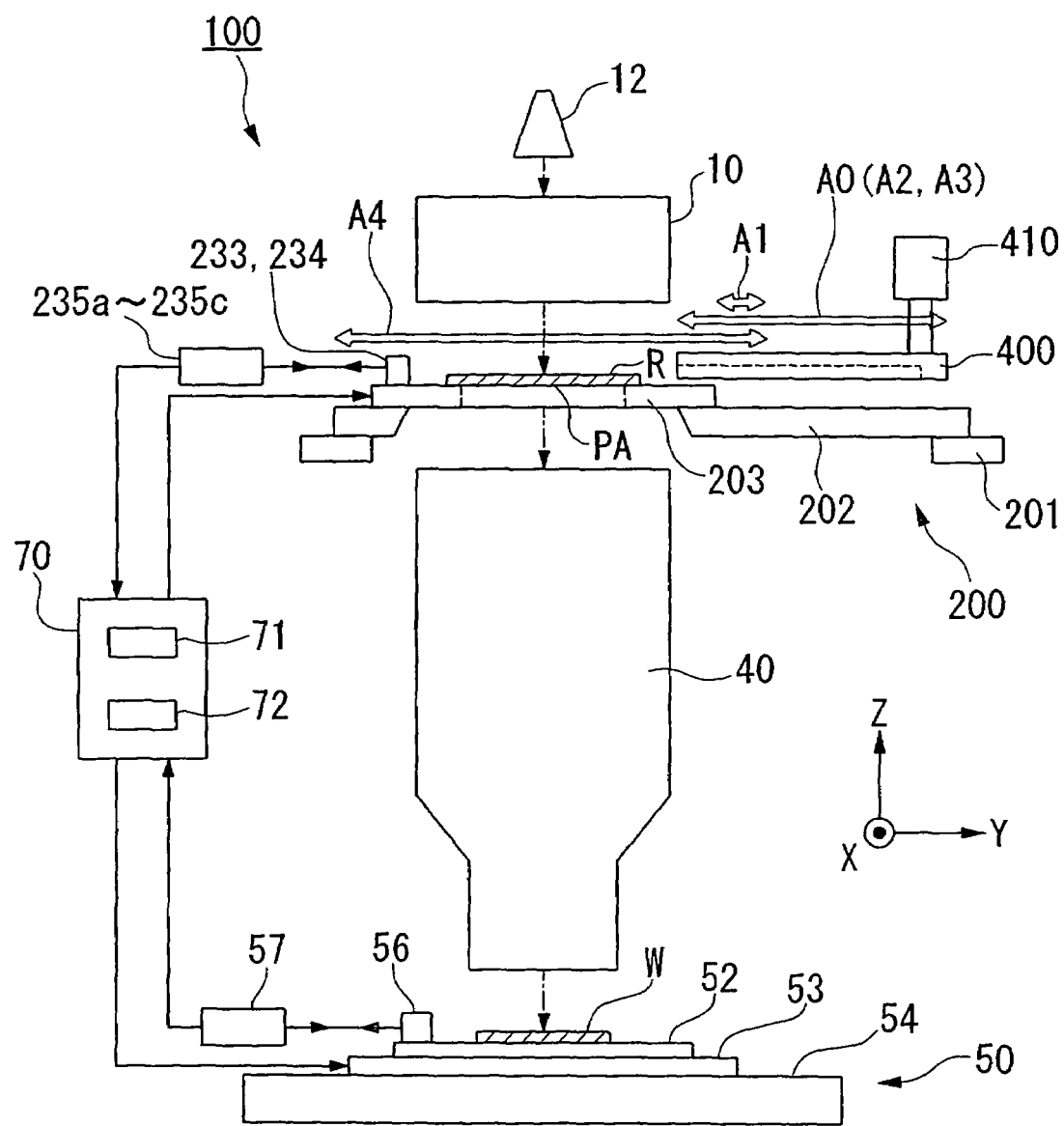
FIG. 3 is a schematic representation showing an exposure apparatus of the first embodiment.

Next, an embodiment in which the above-described reticle stage apparatus 200 is applied to an exposure apparatus 100 is described below. FIG. 3 is a schematic representation showing the exposure apparatus 100.

The exposure apparatus 100 is a step-and-scan type of scanning exposure apparatus, a so-called scanning stepper, in which exposure illumination (exposure light) EL is shined onto a reticle R as the reticle R and the wafer (plate member, substrate) W are caused move relatively in one dimension (direction), so that a patterns (circuit pattern or the like) formed on the reticle R is transferred to the wafer W via a projection optical system 40.

The exposure apparatus 100 is formed by an exposure illumination system 10 that illuminates the reticle R with the exposure illumination EL, a reticle stage 200 that holds the reticle R, a projection optics system 200 that shines exposure illumination light EL emitted from the reticle R onto the wafer W, a wafer stage apparatus 50 that holds the wafer W, and a main control system 70 that performs overall control of the operation of the exposure apparatus 100.

The exposure illumination system 10 has an optical integrator for the purpose of shining the exposure illumination light EL emitted from the light source 12 onto the reticle R with a distribution that is substantially uniform over a prescribed illumination region thereof.

A vacuum ultraviolet beam in the wavelength range from approximately 120 nm to approximately 190 nm, for example an ArF excimer laser (ArF laser) having an oscillation wavelength of 193 nm, a fluorine laser ($F_2$ laser) having an oscillation wavelength of 157 nm, a krypton dimer laser ($Kr_2$ laser) having an oscillation wavelength of 146 nm, or an argon dimer laser ($Ar_2$ laser) having an oscillation wavelength of 126 nm or the like can be used as the exposure illumination light EL.

The reticle stage apparatus 200 is provided directly below the exposure illumination system 10. The specific configuration of the reticle stage apparatus 200 is as described above.

The stage part 203 of the reticle stage apparatus 200 holds the reticle R, with the pattern PA facing downward and moves in a one-dimension scan in the Y direction, and midway in the movement path thereof is a loading region (second region) A2 in which the reticle R is placed onto the reticle holder 211, an unloading region (third region) A3 in which the reticle R is removed from the reticle holder 211, and an exposure region A4 in which the exposure illumination light EL is shined onto the reticle R. Normally, the loading region A2 and the unloading region A3 are coinciding regions (which is hereafter called the loading/unloading region A0) and, as shown in FIG. 3, because of the dimensional restrictions of the apparatus, there is partial overlapping of the loading/unloading region A0 and the exposure region A4. Also the clamp drive region (first region) A1, to be described below, is also included midway in the movement path of the stage part 203.

A cam member 400 that serves as a cam apparatus (conversion apparatus) C which is configured together with the above-described reticle clamp 300 is provided at the upper part within the loading/unloading region A0. The cam member 400 is fixed, via an elevator apparatus to be described later, to either the reticle table 202 or the column 201.

Figure 4A:
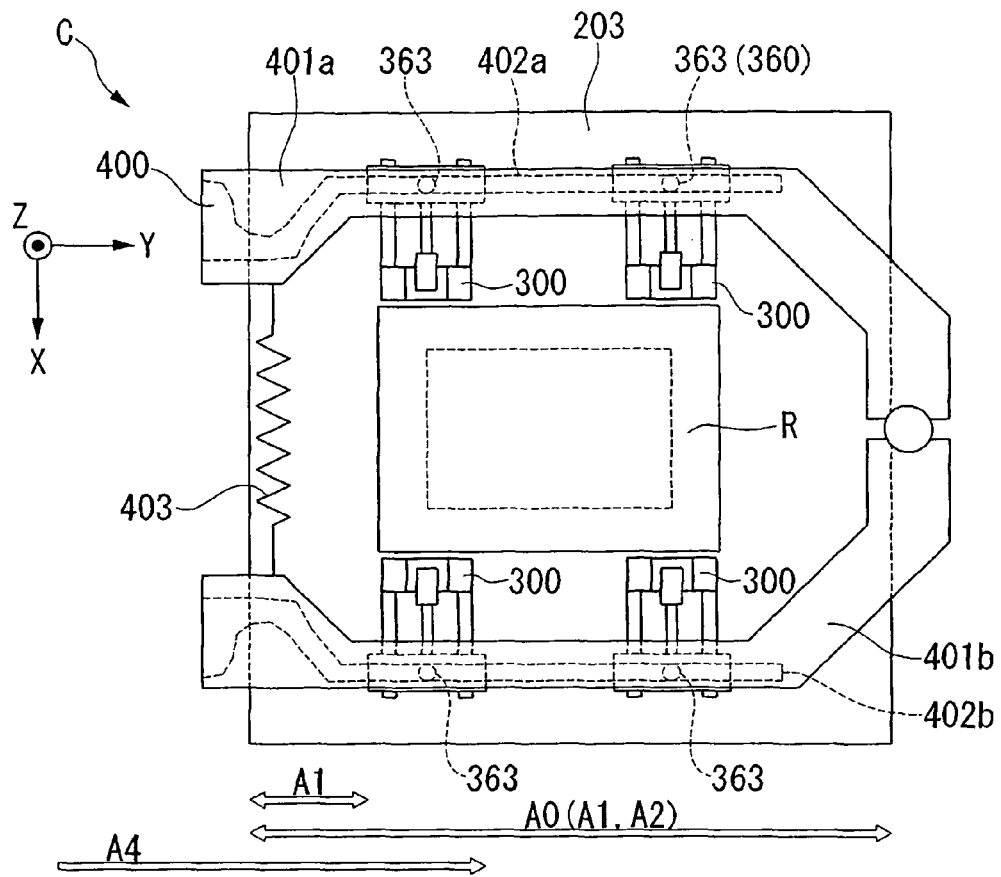
FIGS. 4A and 4B are schematic representations showing a cam member of the first embodiment.
Figure 4B:
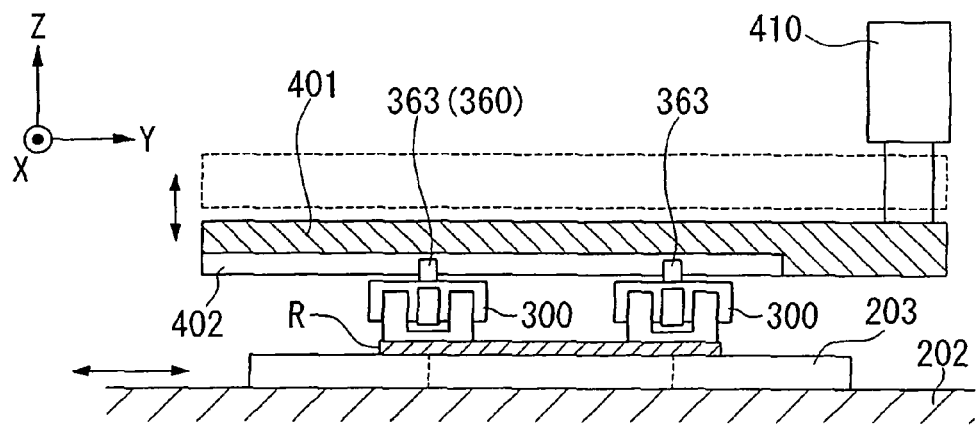

FIG. 4 is a schematic representation showing the cam member 400. The cam member 400 is formed in substantially a channel shape, by rotatably linking the end parts of each of the two members 401a and 401b formed in L shapes so that they are symmetrical.

Grooves 402a and 402b, into which the cam follower 363 of the above-described follower part 360 enters, are formed on the lower surface of the members 401a and 401b. The widths of the grooves 402a and 402b are formed so as to be large at the end parts of the members 401a and 402a, and are made gradually narrower toward the +Y direction so that they are slightly wider than the width of the end parts of the members 401a and 401b. The grooves 402a and 402b are formed so as to veer inward at the end parts, veering gradually outwards as they progress in the +Y direction, after which they reach a width dimension in the part that is parallel to the Y direction that is greater than the reticle R. (Hereinafter, the region in which the grooves 402a and 402b veer inward and then gradually outward is referred to as the clamp drive region A1). Therefore, when the cam follower 363 moves from the left side of the paper in FIG. 4 toward the right in the +Y direction, it enters the widely formed end parts of the grooves 402a and 402b. When there is further movement in the +Y direction, as the clamp drive region A1 is passed, it is guided so as to move from inside to outside.

A spring (shock-absorber) 403 is provided between the members 401a and 402a, at the end of the cam apparatus 400. This rotatably links the members 401a and 401b and, by providing the spring 403, it is possible to make fine movement relative to the cam follower 363 that comes into the grooves 402a and 402b, so that there is a reduction in the shock and friction between the cam follower 363 and the grooves 402a and 402b.

An elevator apparatus (pull-back apparatus) 410 that causes upward movement of the cam member 400 is provided on the cam member 400. The elevator apparatus 410 is formed, for example, by an air cylinder or the like and, by causing the cam member 400 to rise, the cam member 400 and the reticle clamp 300 are separated, so that it is not possible for the cam follower 363 to enter the grooves 402a and 402b. In this manner, the cam member 400 can be pulled back from the loading/unloading region A0, or can be made to intrude into the cam member 400.

Returning to FIG. 3, the projection optical system 40 is a system of a plurality of lenses and reflective mirrors made from fluoride crystals such as lithium fluoride, hermetically sealed in a projection system housing (lens tube). The projection lens system reduces the illumination light shined through the reticle R by a projection ratio of β (β being, for example, ¼), and forms an image of the pattern PA of the reticle R onto a prescribed region (shot region) of the wafer W. Also, the various elements of the projection lens system of the projection optical system 40 are supported in the projection system housing by a respective holding member, each holding member being annular, for example, so as hold each element around its periphery (none are illustrated).

The wafer stage apparatus (stage apparatus) 50 is made up of elements such as a wafer holder 52 that holds the wafer W, and a wafer stage 53 that can move within the XY plane. The wafer holder 52 is supported by the wafer stage 53, and holds the wafer by vacuum chucking. The wafer stage 53 is a pair of blocks that can move in mutually perpendicular directions, superposed on the base 54, and is driving in the XY plane by a drive section that is not illustrated.

Externally provided laser interferometer measuring apparatuses successively detect the X-direction and Y-direction positions of the wafer stage 53, and output these to the main control system 70.

An X moving mirror 56X, formed by a planar mirror, is provided on at the −X direction of the wafer holder 52 so as to extend in the Y direction. A distance measurement beam from the X-axis laser interferometer 57X is shined substantially perpendicularly onto the X moving mirror 56X, and the reflected light therefrom is received by the X-axis laser interferometer 57X, so as to detect the X position of the wafer W. The Y position of the wafer W is detected by a Y-axis laser interferometer 57Y having substantially the same configuration.

By the movement of the wafer stage 53 within the XY plane, the projection position (exposure position) of the pattern PA of the reticle R is positioned at any arbitrary position on the wafer W, and transfers by projection to the wafer W the image of the pattern PA of the reticle R.

The main control system 70 performs overall control of the exposure apparatus 100. For example, it controls the exposure light amount (amount of exposure light illumination), and the positions of the reticle stage apparatus 200, described later, and the wafer stage 53, and performs repeated exposure operations that transfer the pattern PA of the reticle R onto shot regions of the wafer W. The main control system 70 is provided with a processor 71, which performs various calculations, and also a storage unit 72, which records various information.

Next, a method of performing exposure processing that transfers the pattern PA formed on the reticle R to the wafer W by shining exposure illumination light EL onto the reticle R using the exposure apparatus 100 having the above-noted configuration is described below.

The exposure processing method of this embodiment has a step of loading the reticle R onto the reticle stage apparatus 200, a step of pressure holding the reticle R by the reticle clamps 300, a step of releasing the holding of the reticle R by the reticle clamps 300, and a step of unloading the reticle R from the reticle stage apparatus 200. Holding the reticle R and releasing the holding of the reticle R by the reticle clamps 300 will operate with the stage part 203 passing through the clamp drive region A1, as described bellow.

The step of loading the reticle R onto the reticle stage apparatus 200 will now be described. Before the reticle R is placed (in the initial condition), the reticle stage apparatus 200 is at the exposure region (A4). The reticle clamps 300 are in the condition in which the pad parts 320 are either flipped up (refer to FIG. 5A) or lowered (refer to FIG. 5D). Also, the cam member 400 is disposed within the loading/unloading region A0.

By a command from the main control system 70, the stage part 203 moves in the +Y direction, moving from the exposure region A4 up to the loading/unloading region A0, where it stops. Accompanying the movement of the stage part 203, the cam followers 363 of the reticle clamps 300 enter the grooves 402a and 402b of the cam member 400. The cam followers 363 moves first to the inside (direction approaching the reticle R), but when the stage part 203 stops at the loading/ unloading region A0, all of the cam followers 363 pass through the clamp drive region A1, and move to the outside (direction moving away form the reticle R). By doing this, all of the reticle clamps 300 are held in the condition in which the pad parts 320 are in the flipped up condition. The specific operation of the reticle clamps 300 will be described later. The bearing 363a provided on the cam follower 363 and the spring 403 provided on the cam member 400 reduce the contact friction between the cam follower 363 and the grooves 402a and 402b, so that the cam follower 363 moves smoothly in the grooves 402a and 402b.

By a reticle transport apparatus that is not illustrated, a reticle R is transported from outside, placed on the reticle holder 211 above the stage part 203, and the reticle R is vacuum chucked by the reticle holder 211.

Next, in the step in which the reticle R is held by pressure by the reticle clamps 300, −Y-direction movement is done with the reticle R placed on the stage part 203. Accompanying the movement of the stage part 203, when the cam followers 363 of the reticle clamps 300 pass through the clamp drive region A1 they gradually move into the grooves 402a and 402b of the cam members 400. In this manner, by the cam follower 363 moving from the outside to the inside, the reticle clamps 300 are driven, and the reticle R is successively clamped by pressing (clamping).

When the stage part 203 moves further in the −Y direction, by it moving from the loading/unloading region A0 to inside the exposure region A4, the cam followers 363 of the reticle clamps 300 successively are pulled out from the grooves 402a and 402b of the cam members 400. However, the pressure holding of the reticle R by the reticle clamps 300 is maintained by the action of the leaf springs 364.

The operation when the reticle R is held (pressed) by the reticle clamps 300 is described below in detail. FIG. 5 is a drawing showing the operation when the reticle R is held by pressing.

Figure 5A:
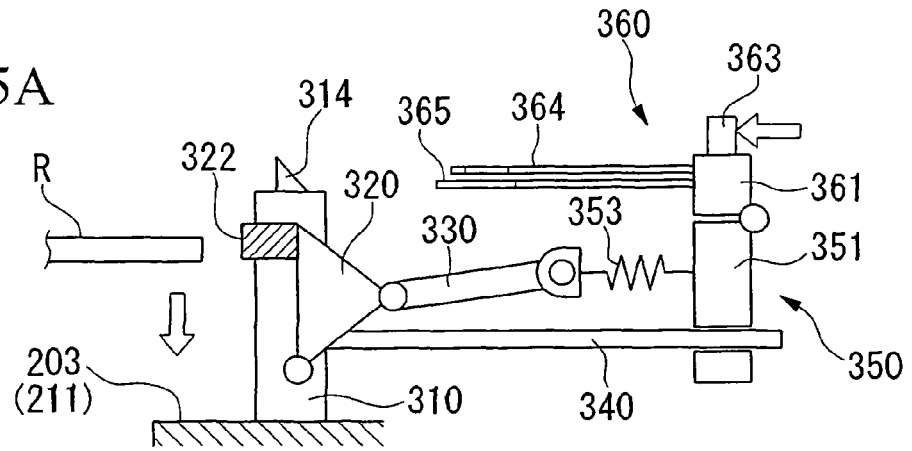
FIGS. 5A, 5B, 5C, and 5D are diagrams of the operation when the reticle clamp of the first embodiment clamps the reticle.

First, as shown in FIG. 5A, the reticle R is placed on the reticle holder 211 on the stage part 203 and held by vacuum chucking. When this is done, because the reticle clamps 300 are in the condition in which the pad parts 320 are flipped up, there is no interference between the reticle R and the reticle clamps 300. After the holding of the reticle R by vacuum chucking, a force directed toward the reticle R side acts on the cam followers 363. That is, this is the case in which the cam followers 363 enter the clamp drive region A1, and start to move along the grooves 402a and 402b of the cam members 400, toward the inside (the direction approaching the reticle R).

Figure 5B:
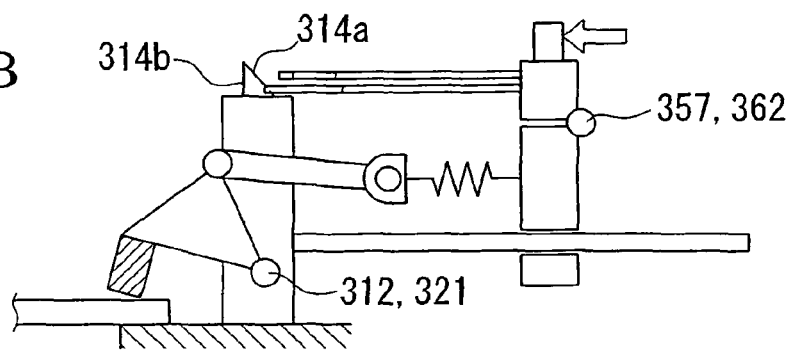

When the force acts on the cam followers 363 in the direction toward the reticle R (toward the left in the drawing), a moment acts that rotates the cam follower 363 about the pin 362 and, as shown in FIG. 5B, because the follower part 360 does not rotate relative to the clamping spring part 350, the follower part 360 acts as one with the clamping spring part 350 and starts to move toward the base part 310, along the sliding guide parts 340. Accompanying this movement, the force that is caused to act on the cam follower 363 is transmitted to the pad part 320 via the link part 330, causing the link part 320 to rotate about the pin hole 321. Also, because the pad parts 320 rotated smoothly, there is almost no deformation of the spring part 353 of the clamping spring part 350.

Figure 5C:
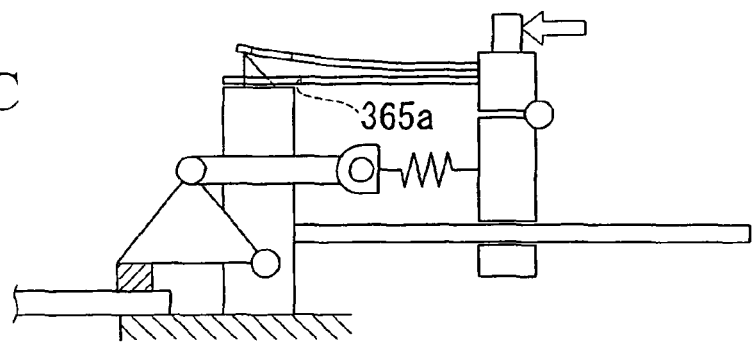

Additionally, when a force acts on the cam follower 363 in the direction toward the reticle R side, as shown in FIG. 5C, the leaf spring 364 of the follower part 360 is butted against the finger part 314 provided at the upper surface of the base part 310, and deforms so as to bend upward along the inclined surface of the finger part 314. Because a channel-shaped cutout 365a is provided in the support plate 365, it does not butt up against the finger part 314, and moves toward the reticle R, avoiding the finger part 314. The pad part 320 rotates further about the pin hole 321, and the contacting part 322 comes into contact with the reticle R. By the contacting part 322 coming into contact with the reticle R, because the pad parts 320 cannot rotate further about the pin hole 321, the spring part 353 of the clamping spring part 350 begins to deform.

Figure 5D:
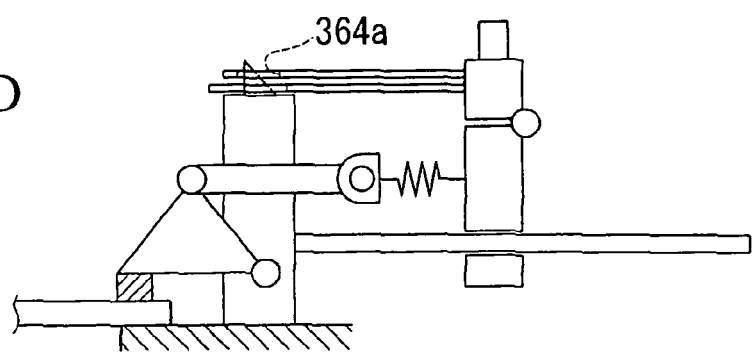

Then, further force acts on the cam follower 363 in the direction toward the reticle R side. That is, the cam follower 363 passes the clamp drive region A1 is in the condition in which it is at the innermost position. When this occurs, as shown in FIG. 5D, the leaf spring 364 rises over the finger part 314 provided at the upper surface of the base part 310, the hole 364a in the leaf spring 364 mating with the finger part 314, and the leaf spring 364 deformation returning to the initial condition (flat condition). The spring part 353 of the clamping spring part 350 further deforms and applies a strong pressing force on the reticle R via the pad part 320.

Finally, in this condition the force on the cam follower 363 directed toward the reticle R is released. That is, the cam follower 363 of the reticle clamp 300 go into the condition in which the cam member 400 pulls out of the grooves 402a and 402b. When the force acting on the cam follower 363 is released, by the spring force of the spring part 353 of the clamping spring part 350 a force acts to move the clamping spring part 350 in the direction of the linear motor side. However, the leaf spring 364 of the follower part 360 linked to the clamping spring part 350 restricts the movement of clamping spring part 350 toward the linear motor. That is, because the hole 364a of the leaf spring 364 mates with the finger part 314 of the base part 310, even if the force acting on the cam follower 363 in the direction of the reticle R is released, by the action of the leaf spring 364 of the follower part 360, the deformation of the spring part 353 is not released, and the condition of pressing the reticle R is maintained.

The reticle clamps 300 hold the reticle R in this manner, with a strong pressing force.

Next, the in the step of performing exposure, before starting the exposure processing the cam member 400 is caused to pull back from the loading/unloading region A0. That is, the elevator apparatus 410 is driven so as to cause the cam member 400 to rise, thereby causing it to move outside the loading/unloading region A0.

After the cam member 400 is caused to pull back, as done in the past, exposure illumination light (exposure light) EL is shined onto the reticle R as the reticle R and the wafer W are caused to move relatively in one direction, so as to transfer onto the wafer W, via the projection optical system 40, a pattern PA formed on the reticle R.

In this manner, the performing of exposure processing after causing the cam member 400 to pull back is in order to prevent the release of the pressing force of the reticle clamps 300 on the reticle R during exposure processing. That is, during exposure processing the stage part 203 moves reciprocally at high speed. As described above, there is a partial overlapping between the exposure region A4 and the loading/unloading region A0. For this reason, if the cam member 400 remains in the loading/unloading region A0, during exposure processing part of the plurality of reticle clamps 300 enter the grooves 402a and 402b of the cam member 400, pass by the clamp drive region A1, and the pressing that holds the reticle R is released.

In this manner, by causing the cam member 400 to pull back from the loading/unloading region A0 before the start of exposure processing, it is possible to prevent the risk of the release of the reticle clamps 300 during exposure processing before it occurs.

Next, the step of releasing the holding of the reticle R by the reticle clamps 300 is described below.

When the exposure processing is completed, the elevator apparatus 410 is driven so as to cause the cam member 400 to move into the loading/unloading region A0. When this is done, the stage part 203 is caused to move in the −Y direction so as to avoid interference with the cam member 400.

Then the stage part 203 is moved in the +Y direction, moving from the exposure region A4 to a position within the loading/unloading region A0. Accompanying the movement of the stage part 203, the cam followers 363 of the reticle clamps 300 enter the grooves 402a and 402b of the cam member 400, and successively pass through the clamp drive region A1, moving from the inside (reticle R side) to the outside. In this manner, by causing the cam followers 363 to move from the inside to the outside, the reticle clamps 300 are driven, and the pressing forces holding the reticle R are successively released.

The operation of releasing of the holding (pressure) on the reticle R by the reticle clamps 300 is described below in detail. FIG. 6 is a drawing showing the operation when the holding of the reticle R is released.

Figure 6A:
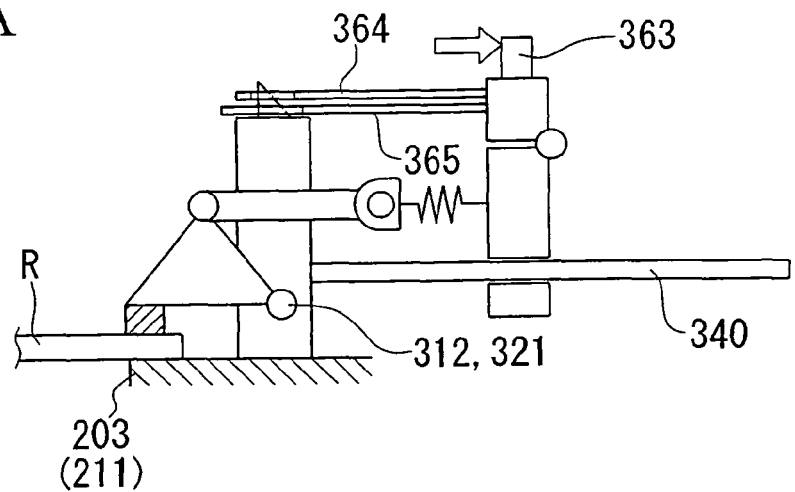
FIGS. 6A, 6B, 6C, and 6D are diagrams of the operation when the reticle clamp of the first embodiment releases holding of the reticle.

First, as shown in FIG. 6A, a force is caused to act on the cam followers 363 in the direction that moves them away from the reticle R (to the right in the drawing). That is, the cam followers 363 of the reticle clamps 300 enter the grooves 402a and 402b of the cam member 400 and enter into the clamp drive region A1, the condition in which movement to the outside (in the direction away from the reticle R) begins.

Figure 6B:
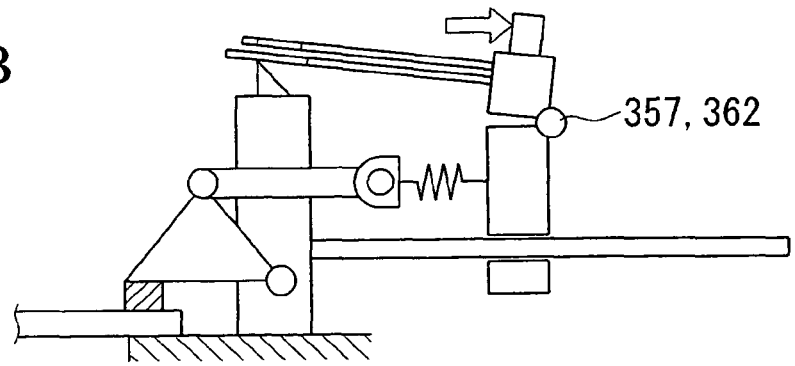

When force is caused to act on the cam follower 363 in the direction away from the reticle R, as shown in FIG. 6B a moment acts that cause the cam follower 363 to rotate about the pad part 320, and the follower part 360 begin to rotate about the pad part 320.

Figure 6C:
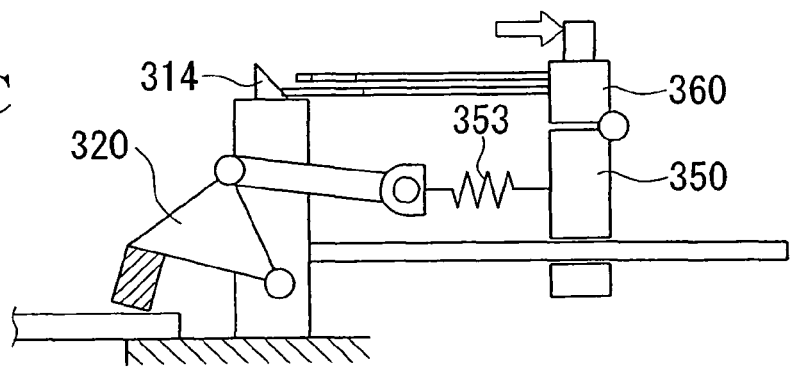

When the follower part 360 rotate a prescribed angle or greater about the pad part 320, as shown in FIG. 6C the hole 364a of the leaf spring 364 rises over the perpendicular surface 314b of the finger part 314, and the mating between the leaf spring 364 and the finger 314 is released. By this occurring, it becomes possible to release the deformation of the spring part 353, and the follower part 360 and clamping spring part 350 act as one in moving along the sliding guide part 340 towards the right side as shown in the drawing. Then, accompanying this movement, because the link part 330 moves to the right side as shown in the drawing, the pad part 320 begins to rotate about the pin hole 321.

Figure 6D:
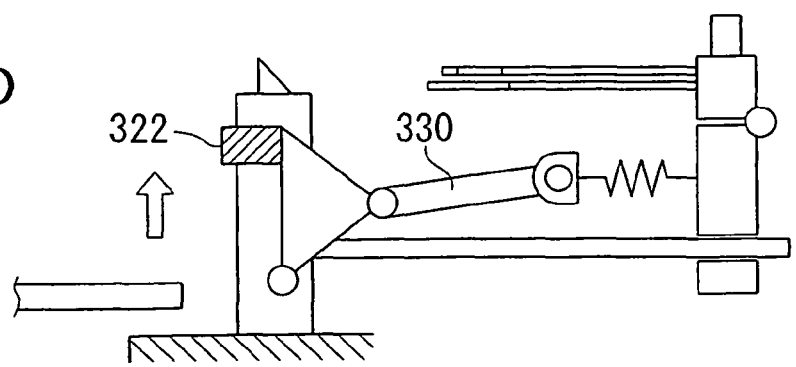

Then, the follower part 360 and the clamping spring part 350 return to the initial position. That is, the cam follower 363 passes through the clamp drive region A1 and goes into the condition in which it has moved to the most outside position. When this happen, as shown in FIG. 6D the pad part 320 flips up and away from the reticle R.

By doing the above, the pressing of the reticle clamp 300 that hold the reticle R is released.

Finally, in the step of unloading the reticle R from the reticle stage apparatus 200, after or as the same time as the holding of the reticle R by the reticle clamps 300 is released, the vacuum chucking of the reticle R by the reticle holder 211 is released. Then, by a reticle transport apparatus that is not illustrated, the reticle R is transported from the top of the reticle stage apparatus 200 towards the outside. In the same manner as when the reticle R is transported onto the reticle stage apparatus 200, because the pad parts 320 of the reticle clamps 300 are in the flipped up condition, the reticle R can be transported out without interference.

By doing the above, it is possible not only to hold the reticle R firmly on the reticle stage apparatus 200, but also to maintain that holding during the exposure processing. Also, the pressing by the reticle clamps 300 that hold the reticle R is released only when the reticle R is placed on and removed from the reticle stage 200.

By holding the reticle R firmly on the reticle stage apparatus 200, even if the reticle stage apparatus 200 is moved with high acceleration, the reticle R does not shift, enabling highly precise transfer of the pattern PA onto the wafer W.

Furthermore, it is desirable to provide a detection apparatus for the purpose of verifying that the pressing by the reticle clamps 300 that holds the reticle R is released. For example, providing a reflective mirror on the upper surface of the link part 330 of the reticle clamp 300 and installing a laser interferometer above the exposure region A4. This having been done, by measuring the height of the upper surface of the link part 330 that passes beneath the laser interferometer, it is possible to detect the operating condition of the reticle clamp 300. Alternatively, it is possible to measure the position of the body 351 of the clamping spring part 350, or to provide a limit switch that is actuated when the body 351 has moved to the rearmost position.

In this manner, by detecting the operating condition of the reticle clamp 300, because the reticle R is held securely on the reticle stage apparatus 200, it is possible to avoid problems caused by release of a reticle clamp 300 during exposure processing.

Next, a second embodiment of a stage apparatus and the like according to the present invention is described below, with references made to FIGS. 7 to 14.

Figure 7:
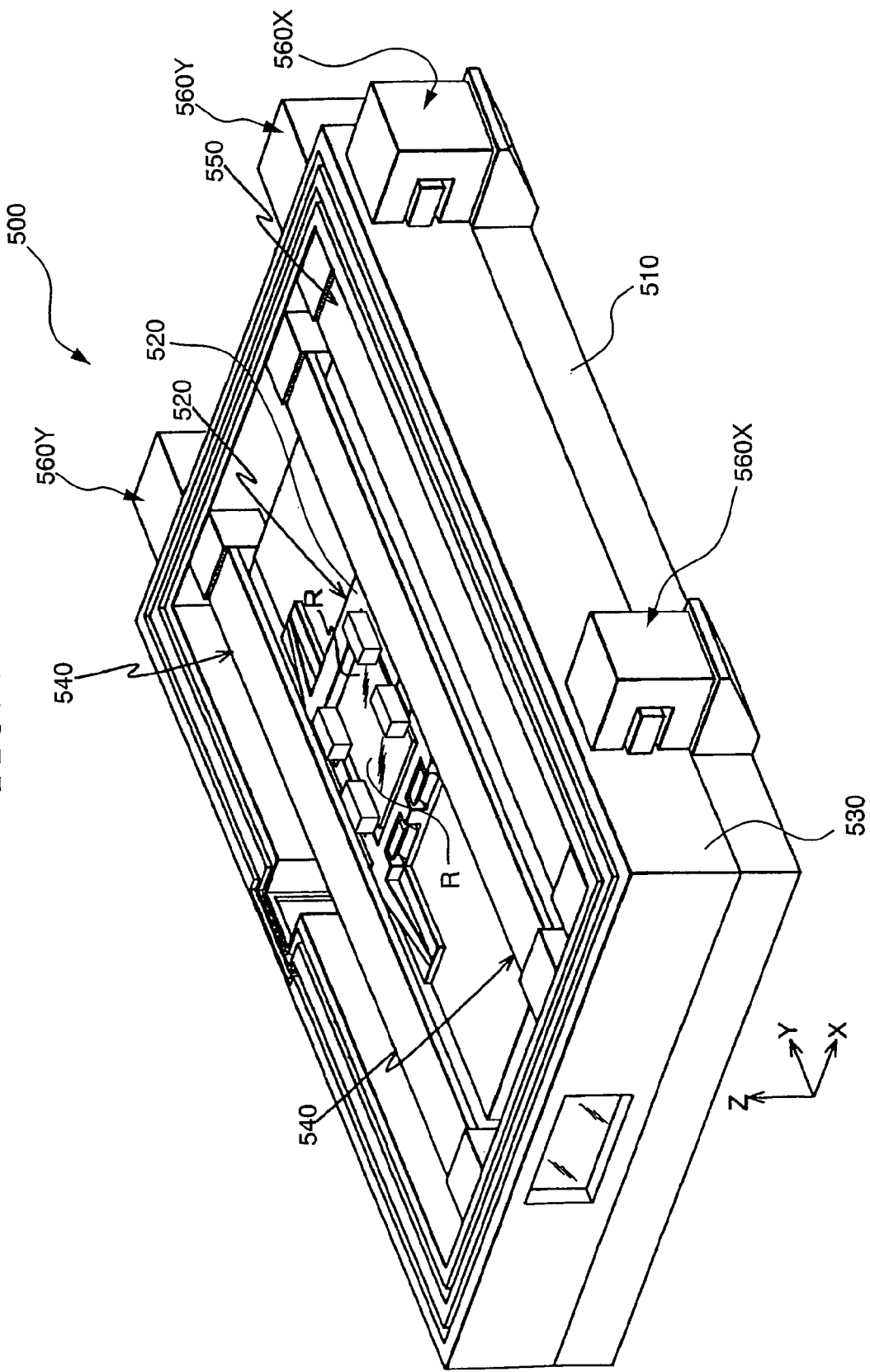
FIG. 7 is an oblique view showing reticle stage apparatus of a second embodiment.
Figure 8:
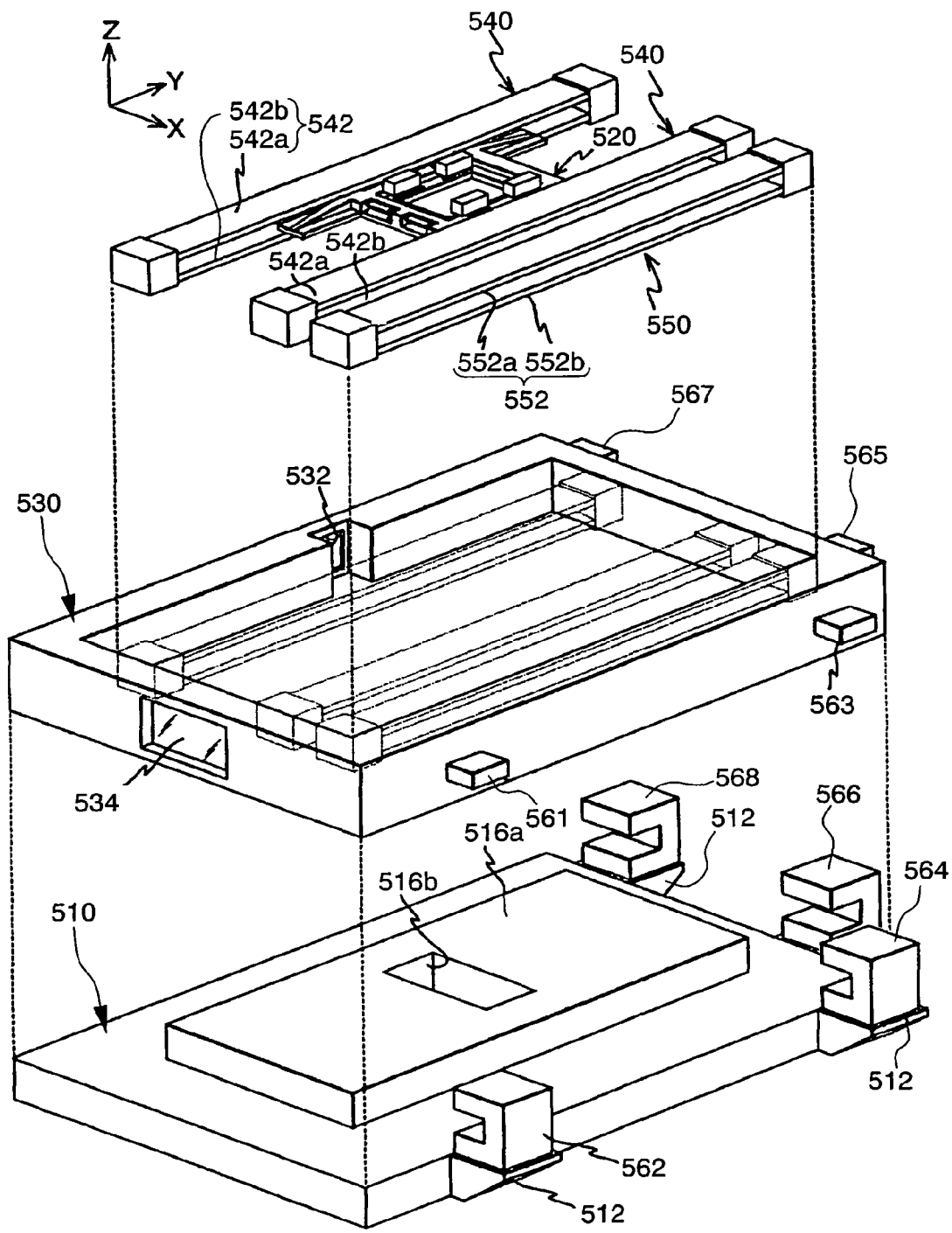
FIG. 8 is an exploded oblique view showing a reticle stage apparatus of the second embodiment.
Figure 9A:
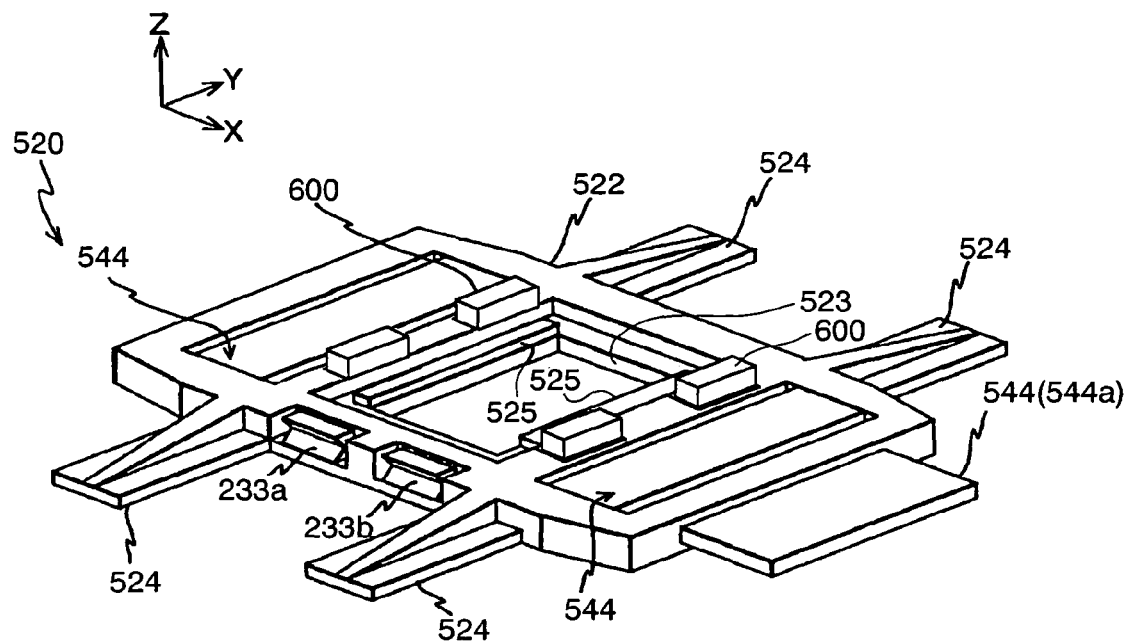
FIG. 9A is an oblique view and FIG. 9B is a cross-sectional view showing the stage part of the reticle stage apparatus of the second embodiment.
Figure 9B:
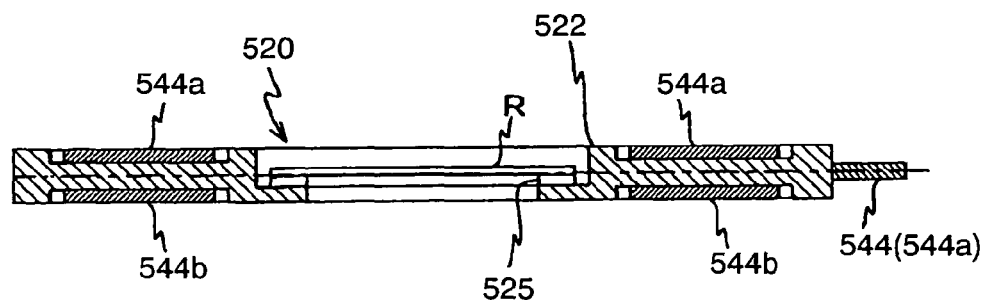
Figure 10:
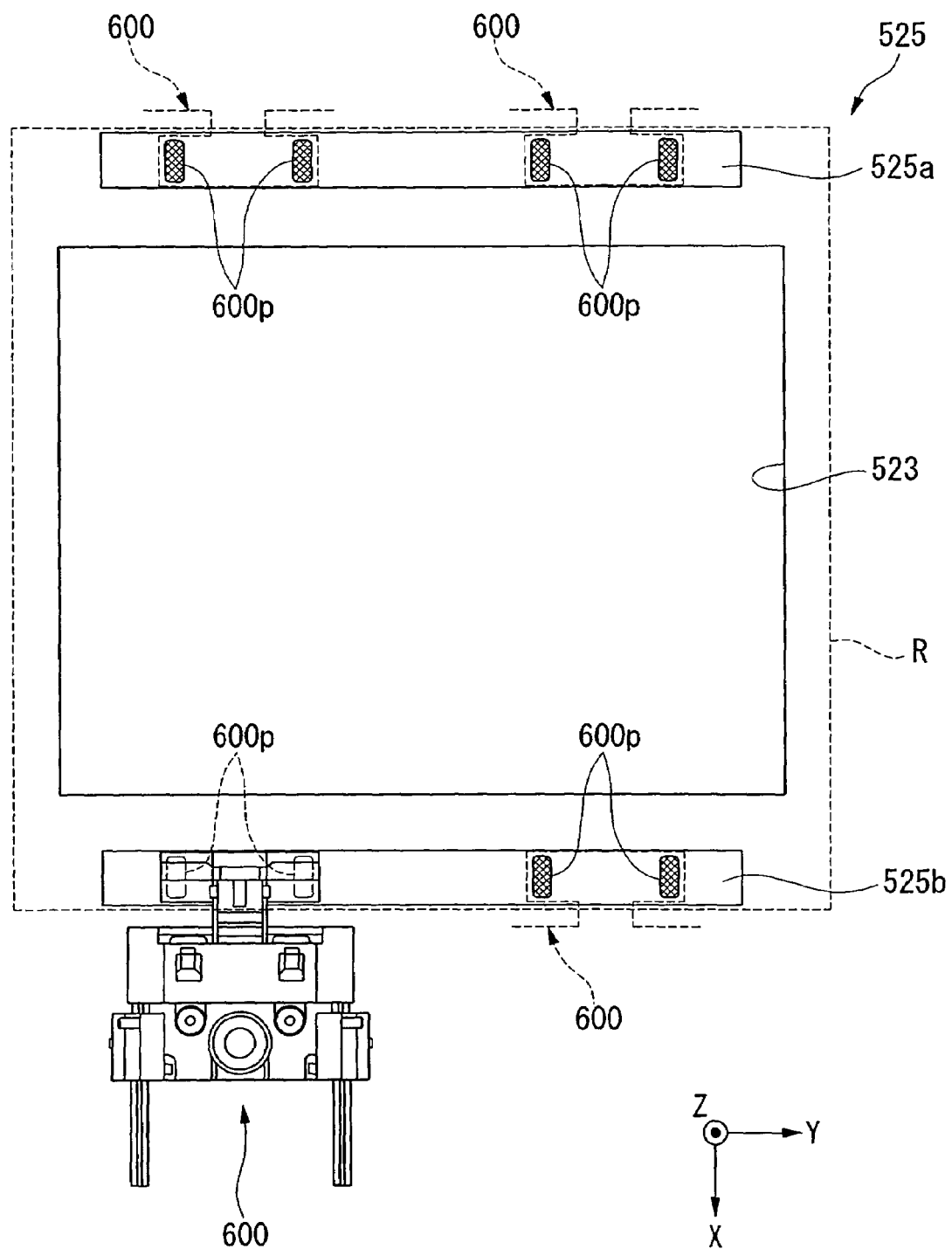
FIG. 10 is a drawing showing the positions of the reticle holders and reticle clamps in the reticle stage apparatus of the second embodiment.
Figure 11:
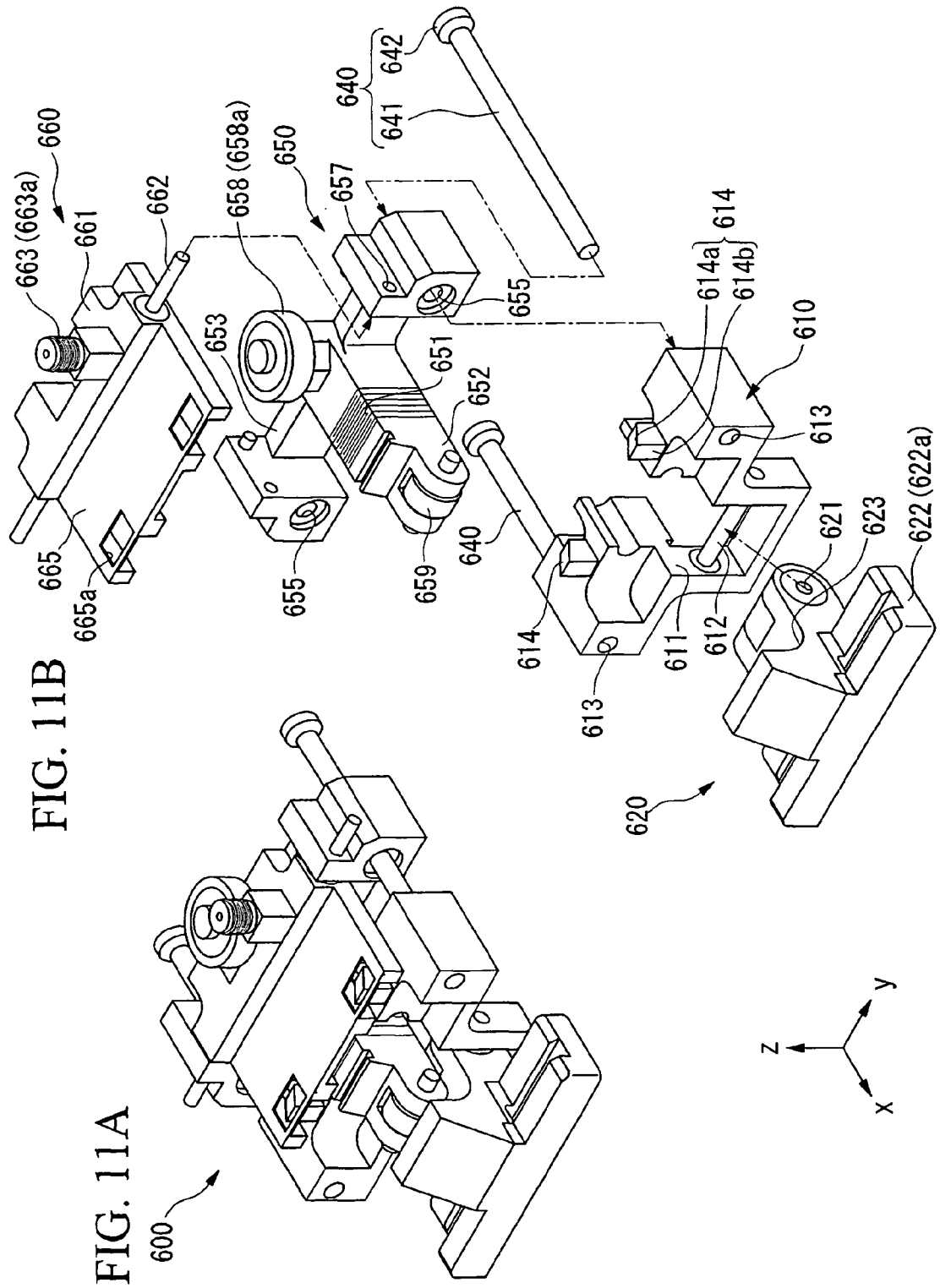
FIGS. 11A and 11B are oblique views showing the reticle clamp of the second embodiment.

FIG. 7 is an oblique view showing the reticle stage apparatus 500 of the present invention, FIG. 8 is an exploded oblique view of the reticle stage apparatus 500, FIG. 9 is an oblique view and a cross-sectional view showing the stage part 520, and FIG. 10 is a drawing showing the positions of the reticle holders 525 and reticle clamps 600. Constituent elements that are the same as in the first embodiment are assigned the same reference numerals and are not described herein.

The reticle stage apparatus 500, as shown in FIG. 7, has elements such as a reticle table 510, a stage part 520, which is driven through a prescribed stroke in the Y direction over the reticle table 510, a frame-shaped member 530 disposed so as to surround the stage part 520, and a reticle stage drive system (linear motor 540 and voice coil motor 550) that drives stage part 520.

The reticle table (base part) 510 is supported substantially horizontally by a support member that is not illustrated. The reticle table 510, as shown in FIG. 8, is formed from an approximately planar member, in the substantially center position of which is formed a protrusion 516a. Additionally, in the substantially center part of the protrusion 516a there is formed a rectangular aperture 516b having the X-axis direction as its longitudinal direction so as to pass the exposure illumination light EL and so as to be a through hole in the Z direction.

As shown in FIG. 9A, the stage part (movement member) 520 is formed by such elements as a stage body 522 that is substantially rectangular in shape, and four extension parts 524, which are provided so as to extend in the Y direction from the stage part 520. On the lower surfaces of each of the four extension parts 524 are formed static pressure air bearings. By doing this, the stage part 520 is supported in non-contact, floating manner, via a clearance of several microns over the reticle table 510.

A pair of Y-direction moving mirrors 233a, 233b formed by corner cubes, is fixed at the −Y-direction end of the stage part 520, and laser interferometers 235a to 235c (refer to FIG. 12) provided at the outer part measure the Y-direction position of the Y moving mirrors 233a and 233b, so as to measure the Y-direction position of the stage part 520 (reticle R) with high precision.

In substantially the center part of the stage body 522 is provided a stepped aperture 523 that forms a path for the exposure illumination light EL, the step part of this stepped aperture 523 (part that is one step down) being provided with a reticle holder (placement surface) 525 that vacuum chucks the reticle R from the bottom. Additionally, four reticle clamps 600 are provided at both edges of the stepped aperture 523 (two at each edge). The configuration of the reticle clamps 600 is described later.

As shown in FIG. 10, the reticle holder 525 has vacuum chucking surfaces 525a and 525b formed so as to be rectangular along the Y direction at the outside of the stepped aperture in the X direction, these holding the regions of the reticle R at the X-direction edges by vacuum chucking from the bottom of the reticle. It is possible to used electrostatic chucking in place of vacuum chucking, and further possible to use a combination of electrostatic chucking and vacuum chucking.

Four reticle clamps 600 are provided further to the outside of the reticle holders 525 in the X direction, and a region at ends of the reticle R in the X direction that is vacuum chucked by the reticle holders 525 is held by pressing at a plurality of points from both sides of the reticle. Because each of the reticle clamps 600 press onto the reticle R at two points (and have two clamping areas 600p), the reticle R is held by pressing at a total of eight points.

As shown in FIG. 10, the positions of pressure onto the reticle R by each of the reticle clamps 600 are set so as to be positions that overlap with the vacuum chucking surfaces 525a and 525b, although there is no restriction in this regard. For example, it is possible to divide the vacuum chucking surfaces 525a and 525b into a plurality of regions, with the vacuum chucking regions and pressure holding regions positioned alternately in the Y direction. Also, it is possible to establish positions so that the inside of the reticle R (side near the stepped aperture 523) is held using vacuum chucking and the outside thereof is held using pressing or, in reverse, so that the inside of the reticle R is held by pressing and the outside thereof is held by vacuum chucking. Although there is no particular restriction on the size of the clamping area 600p, it can be set, for example, to have a width in the Y direction of 20 to 40 mm and a width in the X direction of 5 to 20 mm at each reticle clamp 600.

The pressure holding force by a reticle clamp can be made, for example 0.5 to 2.0 kgf at one clamping area 600p. The pressure holding force by the reticle clamps 600 and the vacuum chucking force on the reticle R at the reticle holders 525 can be set so that there is a ratio of 2-to-3 or 2-to-5 when taking the overall reticle R. Because setting the proportion of pressure holding force by the reticle clamps 600 so as to be large leads to the possibility of deformation of the reticle R, it is preferable that the pressure force of the reticle clamps 600 and vacuum chucking force of the reticle holders 525 be appropriately set so that such deformation does not occur.

A moving piece unit 544 of the linear motor 540 is disposed at both sides of the stepped aperture 523 in the stage part 520. The moving piece units 544, as shown in FIG. 9B, have a pair of pole units 544a, 544b embedded in the upper and lower surfaces of the stage body 522. Additionally, the armature 544 of a voice coil motor 550 is disposed at the X-direction end part. A planar permanent magnet 554a is used as the moving piece unit 544.

The reticle stage drive system is formed by a pair of linear motors that drive the stage part 520 in the Y direction and provide fine drive in the θz direction. The pair of linear motors 540 is formed by a stator unit 542 and the above-described armature unit 544, which are each set over in the Y direction at the X direction inside of a frame member 530. The voice coil motor 550 is formed by a stator unit 552 and the above-described moving piece unit 554, which are each set over in the Y direction at the −X direction inside the frame member 530.

The stator unit 542 is formed by a pair of Y-axis linear guides 542a and 542b oriented lengthwise in the Y-axis direction, and fixed to an inner wall surface of the frame member 530 so as to be mutually opposing with a prescribed spacing therebetween in the Z direction and also so as to parallel to the XY plane. A plurality of armatures are disposed inside the Y-axis linear guides 542a and 542b, with a prescribed spacing. The magnetic pole units 544a and 544b of the stage part 520 are disposed between the Y-axis linear guide 542a and 542b, with a prescribed clearance therebetween.

The stator unit 552 is formed by a pair of armature units 552a and 552b oriented lengthwise in the Y-axis direction, which are fixed to an inner wall surface of the frame member 530 so as to be mutually opposing with a prescribed spacing therebetween in the Z direction and also so as to parallel to the XY plane. The permanent magnet 554a of the stage part 520 is disposed between the armature units 552a and 552b with a prescribed clearance therebetween.

In this manner, a moving magnet type linear motor 540 that can move the stage part 520 in the Y direction is formed by the Y-axis linear guides 542a and 542b and the magnetic pole units 544a and 544b. The armature units 552a and 552b, together with the permanent magnet 554a, forms a moving magnet type voice coil motor 550 that can perform fine movement the stage part 520 in the X direction.

When electrical current is supplied to the armature coils within the Y-axis linear guides 542a and 542b, Y-direction drive force is generated that drives the stage part 520 in the Y direction. When electrical current flows in the Y-axis direction in the armature coils of the armature units 552a and 552b, drive force is generated that drives the stage part 520 in the X direction.

The frame member (second movement member) 530 has a gas static pressure air bearing formed on the lower surface thereof. By doing this, the frame member 530 is held in a non-contacting floating manner with a clearance of approximately several microns over the reticle table 510. Moving pieces 561, 563, 565, and 567 formed by magnetic units are provided on the +X direction and −X direction surfaces of the frame member 530. Stators 562, 564, 566, and 568, formed by armature units are provided so as to be opposite these moving pieces 561, 563, 565, and 567 via a support 512. The moving pieces 562, 563, 565, and 567 have permanent magnets on the inside thereof, and form magnetic fields in the Z direction. The stators 562 and 564 have armature coils on the inside thereof, and current flows therein in the Y direction. The stators 566 and 568 have armature coils on the inside thereof, and current flows therein in the X direction.

Therefore, a trim motor 560X for the purpose of X-direction drive is formed by a moving magnet type voice coil motor by the moving pieces 561 and 563 and the stators 562 and 564. In the same manner, a trim motor 560Y for Y-direction drive is formed by a moving coil voice coil motor by the moving pieces 565 and 567 and the stators 566 and 568. In this manner, the four trim motors 560X and 560Y can drive the frame member 530 with three degrees of freedom, in the directions of X-axis direction, Y-axis direction, and $\theta_Z$ direction. Window glasses 532 and 534 are fitted into the −X direction and −Y direction side walls of the frame member 530, enabling a length measurement beam from the laser interferometers 235a to 235c that measure the position of the stage part 520 to pass through.

The Y-direction position of the stage part 520 is measured by the length measurement beams emitted from the laser interferometers 235a to 235c being passed through the window glass 534 so as to strike the Y moving mirrors 233a and 233b and by detecting the reflected light therefrom. The X-direction position and $\theta_Z$-axis position of the stage part 520 is measured by shining a plurality of length measurement beams onto an X fixed mirror (not illustrated) fixed to the reticle table 510, and detecting the light reflected therefrom. The X moving mirror is formed longitudinally along the Y direction so as to cover the movement range of the stage part 520, and is installed on the outer part of the frame member 530. A length measurement beam that passes through the window glass 534 has its light path bent by approximately 90 degrees by an optical element fixed to the stage part 520, after which it passes through the window glass 532 and reaches the X fixed mirror. It is also possible to not provide window glasses 532 and 534 on the frame member 530, but rather to dispose the above-noted length measurement beam emitting part and X fixed mirror on the inside of the frame member 530 (inside the frame).

In a reticle stage apparatus 500 configured in this manner, repelling force accompanying the movement of the stage part 520 is cancelled out by the movement of the frame member 530. For example, when the stage part 520 is driven in the X direction, the moving piece of the voice coil motor 550 is driven as one with the stage part 520 in the X-axis direction, and the repelling force to the drive force acts on frame member, to which the stators of the voice coil motor 550 (armature units 552a and 552b) and stators are fixed. Because the frame member 530 is supported in a non-contacting manner with a prescribed clearance with respect to the reticle table 510, by the above-described repelling force the frame member 530 moves in a direction responsive to the repelling force by an amount in accordance with the law of conservation of motion. In the same manner, in the case of drive in the Y-axis direction, the frame member 530 moves in accordance with the law of conservation of motion. In particular, because the frame member 530 is formed so as to surround the stage part 520, it inevitably grows large and heavy. It is therefore possible to make the ratio of weight with the stage part 520 be high. For this reason, the movement distance of the frame member 530 can be relatively short. Also, in this embodiment because the reticle clamps 600 are mounted to the stage part 520, the weight of the frame member (counter mass) 530, in consideration of the weight of the stage part 520, which includes the reticle clamps 600, is set to achieve a prescribed weight ratio.

Next, the configuration of the reticle clamp 600 is described in detail. FIG. 11A is an oblique view of a reticle clamp 600, shown in the condition in which it is holding the reticle R by pressing. FIG. 11B is an exploded oblique view of the reticle clamp 600. Also, because the reticle clamp 600 has the same basic configuration as the reticle clamp 300, parts that are the same as the reticle clamp 300 are assigned the same reference numerals and are described briefly herein.

The reticle clamp (fixing apparatus) 600, as shown in FIG. 11B, is formed by a base part 610, a pad part 620, slide guides 640, a clamping spring 650, and a follower part 660.

The base part 610 is a member that is substantially the same as the base part 310, in which a pin 612 provided in a channel part 611 rotatably supports a pad part 620 to be described below. The slide guides 640, each of which is formed by a rod member 641 and a stopper part 642, are inserted into and fixed in the two guide insertion holes 613, which are provided on either side. Also, two finger parts 614, having an inclined surface 614a and a substantially vertical surface 614b are provided on the upper surface of the base part 610.

The pad part 620 is formed from a member that is substantially triangular viewed from the side (Y direction), and has a pin hole 621 provided on one vertex part thereof. As described above, the pin 612 of the base part 610 mates with the pin hole 621. By doing this, it is fit into and rotatably supported by the channel part 611 of the base part 610. Also, a spring mechanism is located within the mating part between the pin hole 621 and the pin 612, thereby providing an impelling force that flips up the pad part 620. A contacting part 622 making contact with the reticle R placed onto the reticle holder 525 is provide on the lower surface of the pad part 620. The contacting part 622 is formed so as to extend in the Y direction. This is to support the reticle R over a larger surface or press it at a plurality of points. In this embodiment, as shown in FIG. 10, each contacting part 622 has two clamping areas 600p, the reticle R being held at these two points by a uniform force. The contacting part 622 is formed by a resilient body 622a, so as not to damage the reticle R, and the periphery thereof is beveled.

An arc-shaped surface 623 that makes contact with the linking part 652 of the clamping spring part 650, described below, is formed at another vertex part disposed at the top. This arc-shaped surface 623, together with the roller 659 of the linking part 652, forms a cam mechanism. Specifically, by the arc-shaped surface 623 being pressed in the +X direction by the roller 659 of the linking part 652, the pad part 620 is caused to rotate about the pin hole 621.

It is possible to provide a resilient pivot at the clamping point, so as to enable pressing on the reticle R with the same condition at all times, regardless of error or variations in the thickness of the reticle R.

The clamping spring part 650 is formed by a body part 651, a linking part 652, and a spring part 653, a linked structure being formed by the body part 651, the linking part 652, and the spring part 653. The body part 651 is provided with two holes 655, which made with the slide guides 640, thereby enabling support and movement along the X direction.

The clamping spring part 650 is formed by a body part 651, a link part 652, and a spring part 653, the structure thereof being such that the body part 651 and the link part 652 are linked by the spring part 653. The body part 651 has a cam followers 358 provided at substantially the center of its upper part. Additionally, holes 657 which mate with the follower part 660 are provided in both ends of the upper part of the body part 651. The cam follower 658 is provide with a bearing 658a for the alleviation of friction when contact is made with the cam member 700 that is described later. The link part 652 is provided with a roller 659 on the end thereof, which is made of a member that extends in the X direction. The spring part 653 is formed by a resilient hinge mechanism, and links the link part 652 to the body part 651 so as to enable movement in the X direction. Also, the spring force of the spring part 653 applies a pressing force that holds the reticle R.

The follower part 660 is formed by a body part 661, pin parts 662 provided on both ends of the body part 661, a cam followers 663 provided on the upper part of the body part 661, and a holding plate 665 extending in the +X direction. The follower part 660, pin the pin parts 662 mating with the hole part 657 is rotatably supported by the clamping spring part 650. In the mating part between the pin parts 662 and the hole part 657 a spring mechanism is incorporated, so that the holding plate 665 is pushed and impelled downward, so that the holding plate 665 is substantially horizontal.

At the ends on both sides of the holding plate 665 are provided rectangular holes that mate with the finger parts 614 of the base part 610. The cam followers 663 is provided with a bearing 663a for the purpose of alleviating friction when contact is made with the cam member 700.

Figure 12:
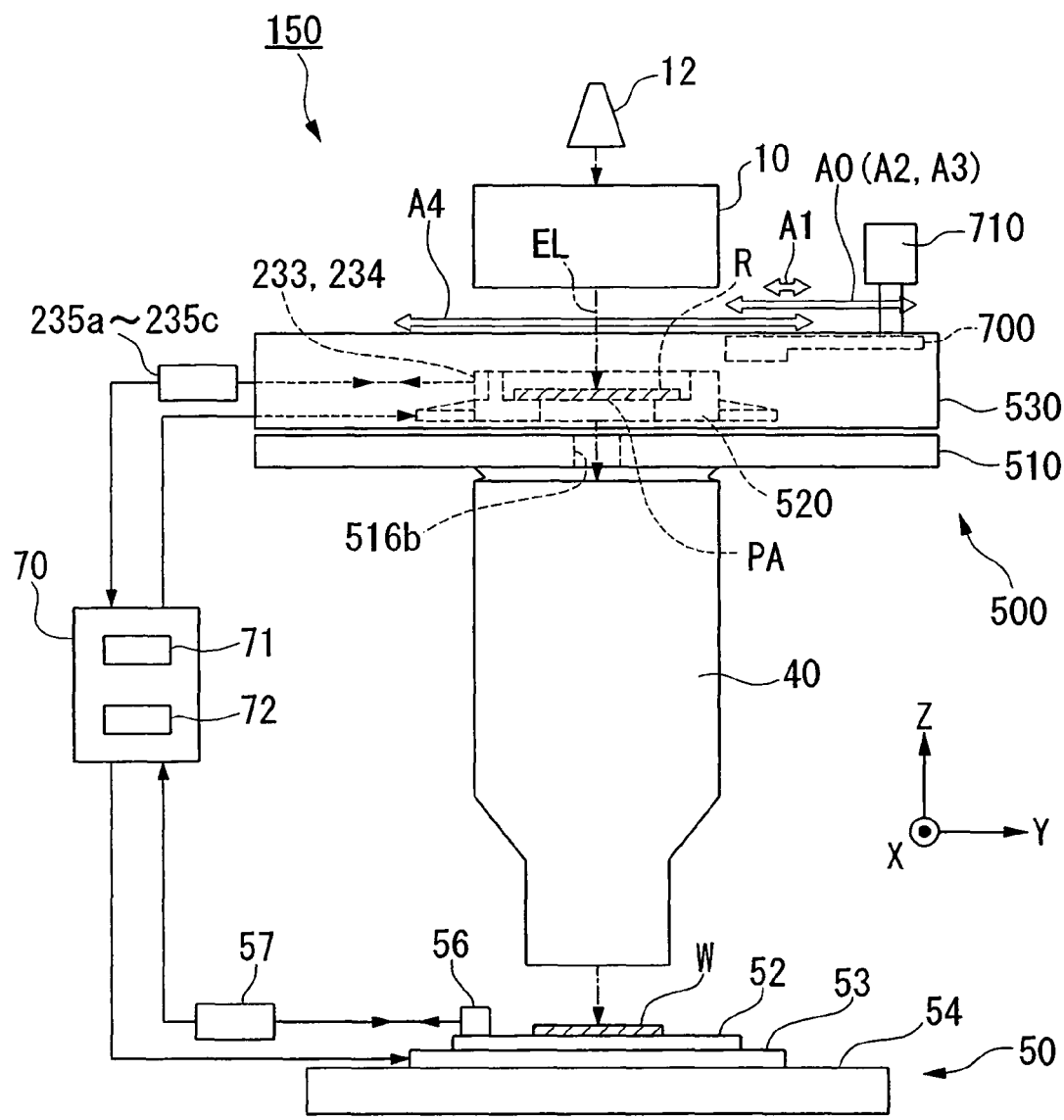
FIG. 12 is a schematic representation showing an exposure apparatus of the second embodiment.

Next, an embodiment to which the exposure apparatus 150 is applied to the above-described reticle stage apparatus 500 is described. FIG. 12 is a schematic representation showing the exposure apparatus 150. Because the exposure apparatus 150, with the exception of the reticle stage apparatus 500, is the same as the exposure apparatus 100, same elements are assigned the same reference numerals and are not described herein.

The reticle stage apparatus 500 is provided directly beneath the exposure light illumination system 10. The specific configuration of the reticle stage apparatus 500 is as described above.

Similar to the case of the reticle stage apparatus 200, a loading/unloading region A0 (loading region A2 and unloading region A3), a clamp drive region A1, and an exposure region A4 are provided midway in the path of the stage part 520. A cam member 700, in which the above-described cam followers 658 and 663 of the reticle clamp 600 are formed as one, is disposed at the upper part within the loading/unloading region A0 as a cam mechanism (conversion apparatus) C2. The cam member 700 is fixed to the reticle table 510 and the like via an elevator apparatus 710.

Figure 13A:
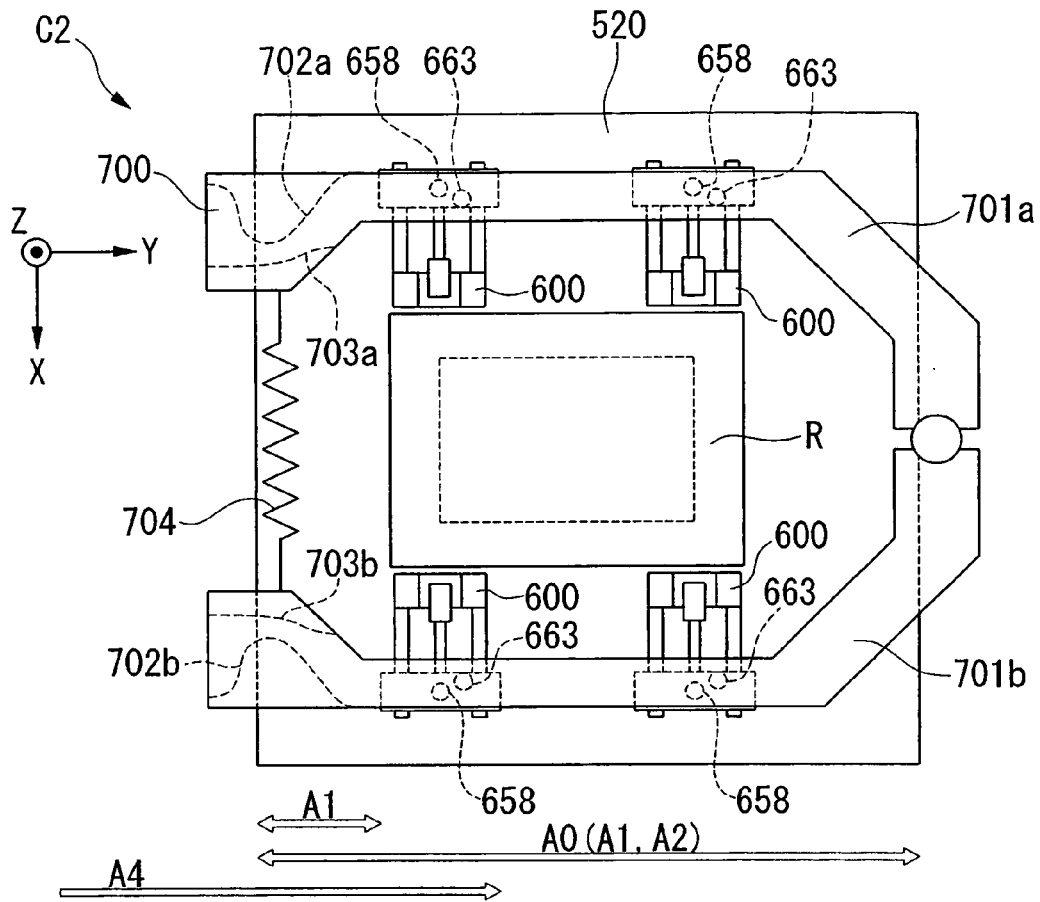
FIGS. 13A and 13B are oblique views showing the cam member of the second embodiment.
Figure 13B:
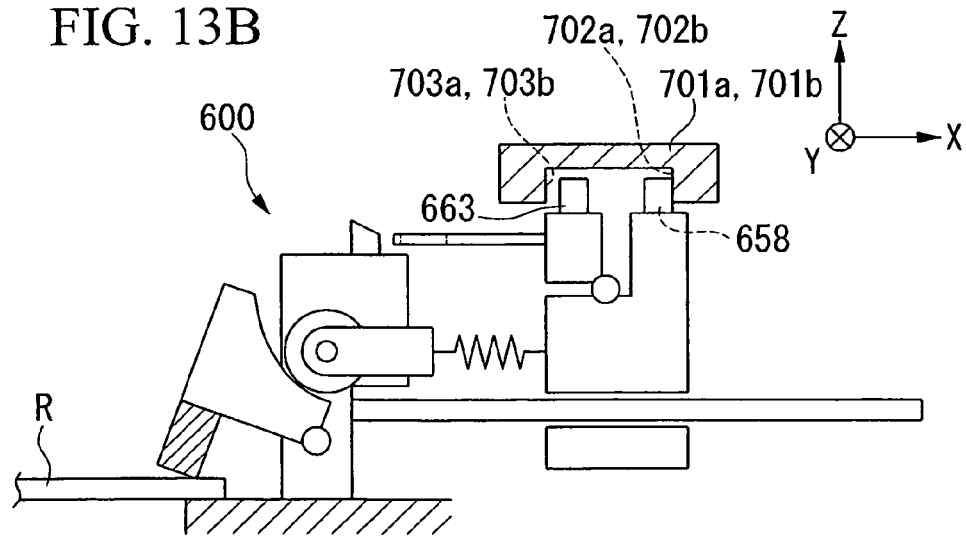

FIG. 13 is a schematic representation showing the cam member 700. The cam member 700 has a structure substantially the same as that of the cam member 400. On the lower surface of the end parts of each of the members 701a and 701b of the cam member 700 are formed protrusions 702a, 702b, 703a, and 703b, which are contacted by the above-described cam followers 658 and 663. Specifically, the cam follower 658 comes into contact with the side walls of the protrusions 702a and 702b, and the cam follower 663 comes into contact with the side walls of the protrusions 703a and 703b. Also, a hard chrome plating using a tempered material (for example SUS420J annealed material) is provided on the side walls of the protrusions 702a, 702b, 703a, and 703b for the purpose of reducing friction with the cam followers 658 and 663. It is also possible to use a tempered material that has been hard-chrome plated at locations other than the came member 700 requiring measures with regard to friction.

The spacing between the protrusions 702a and 703a and between 702b and 703b in the X direction are made large at the end parts of the members 701a and 701b, this narrowing gradually toward the +Y direction, and becoming large once again. In particular, the protrusions 702a and 702b are formed so as to veer inward at the end parts, veering gradually outwards as they progress in the +Y direction. (The region in which the protrusions 702a, 702b, 703a, and 703b are formed is referred to hereafter as the clamp drive region A1.)

By doing this, when the cam followers 658 and 663 move in the +Y direction from the left side of the drawing FIG. 12A, the cam followers 658 and 663 enter between the protrusions 702a and 703a and between 702b and 703b. When passing the clamp drive region A1, first the cam follower 658 makes contact with the protrusions 702a and 702b and, after first being guided so as to move from the outside toward the inside, is guided so as to once again move from the outside toward the inside. The cam follower 663, moves so as to track the cam follower 658, and when contact is made with the protrusions 703a and 703b, the cam follower 658, in reverse of the cam follower 663, is guided so as to approach the cam follower 658.

Similar to the cam member 400, a spring (shock-absorber) is provided at the end of the cam member 700, and an elevator apparatus (pull-back apparatus) 710 is provided at the end of the cam member 700.

The contact point between the cam member 700 and the cam follower 663 is established so as to be low at the side of reticle clamp 600 closing (open-to-closed) and high at the side of the reticle clamp opening (closed-to-open). By doing this, the moment load generated when the clamp 600 closes is made small, and it is possible when opening to have the holding plate easily be removed from the finger part 614.

Next, the exposure processing using the exposure apparatus 150 will be explained. Because the great part thereof is the same as to the first embodiment, only the operation of the reticle clamp 600 is described below.

FIG. 14 is a drawing showing the operation of the reticle clamp 600 when the reticle R is held by pressing.

Figure 14A:
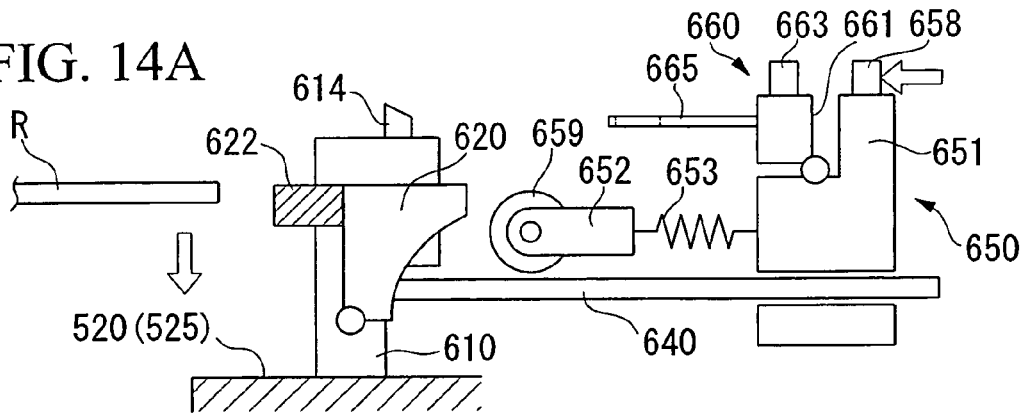
FIGS. 14A, 14B, 14C, and 14D are diagrams showing the operation when the reticle clamp of the second embodiment clamps the reticle.

First, as shown in FIG. 14A, in the initial condition of the reticle clamp 600, the pad part 620 is maintained in the flipped-up condition. This is because it is impelled by the spring mechanism incorporated into the mating part between the pin hole 621 and the pin 612.

When the reticle R is placed on the reticle holder 525 on the stage part 520 and held by vacuum chucking, a force acts on the cam follower 658 towards the reticle side. That is, this is the case in which the cam followers 358 enters the clamp drive region A1 and begins to move toward the inside (direction approaching the reticle R) along the protrusions 702a and 702b of the cam member 700.

Figure 14B:
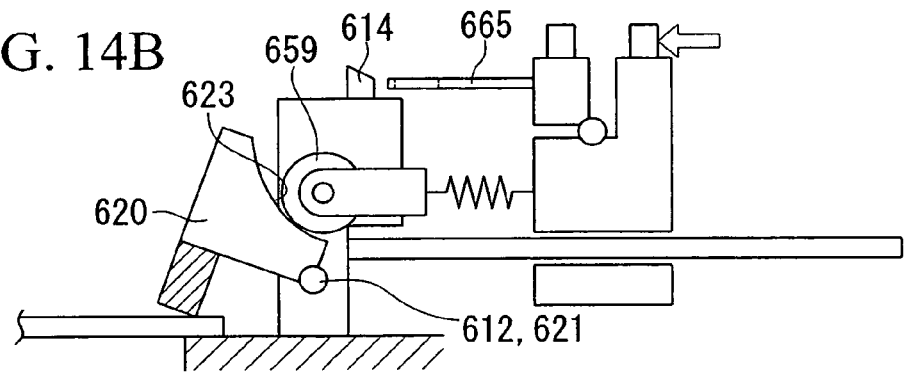

When the force acts on the cam followers 358 in the direction towards the reticle R (towards the left in the drawing), the follower part 660 and the clamping spring part 650 become as one, as shown in FIG. 14B, and begin to move towards the base part 610 along the slide guide 640. This is because, as described above, the cam followers 663 tracks to the cam follower 658 as it moves.

Accompanying the movement of the clamping spring part 650, the force caused to act on the cam followers 358 is transmitted from the roller 659 provided on the end of the link part 652 to the pad part 620, via the arc-shaped surface 623 of the pad part 620, thereby causing the pad part 620 to rotate about the pin hole 621.

Figure 14C:
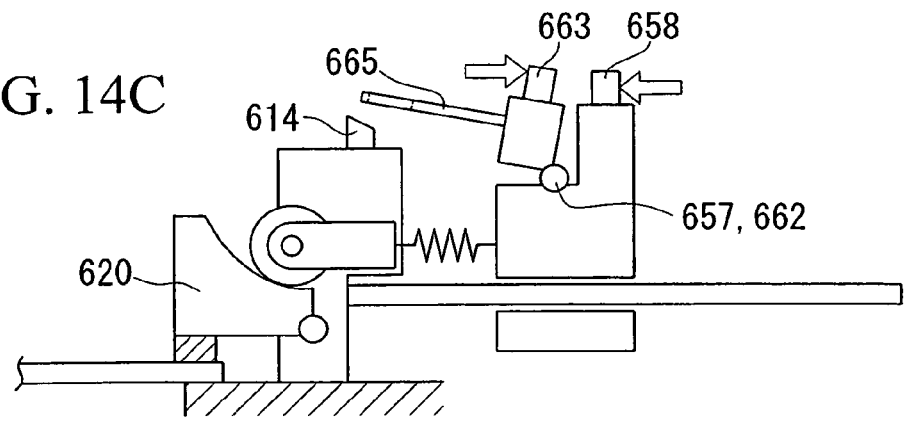

Then, as shown in FIG. 14C, just before the holding plate 665 comes into contact with the finger part 614 of the base part 610, a force is caused to act on the cam followers 663 in the direction moving away from the reticle R (to the right in the drawing). That is, this is the case in which the cam followers 663 within the clamp drive region A1 has started moving along the protrusions 703a and 703b of the cam member 700, toward the outside (direction away from the reticle R). By this occurring, the follower part 660 rotates about the pin part 662, and the holding plate 665 is flipped upward.

The pad part 620 rotates further about the pin hole 621, and the contacting part 622 comes into contact with the reticle R. Because by the contacting part 662 contacting the reticle R, the pad part 620 can rotate no further about the pin hole 621, the spring part 653 of the clamping spring part 650 begins to deform.

Figure 14D:
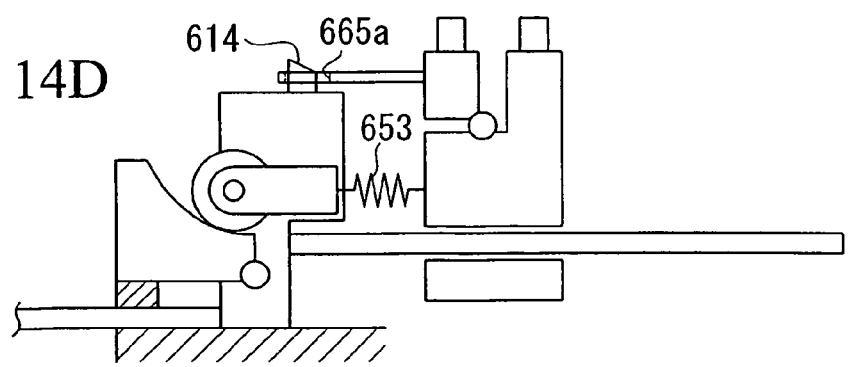
Figure 15:
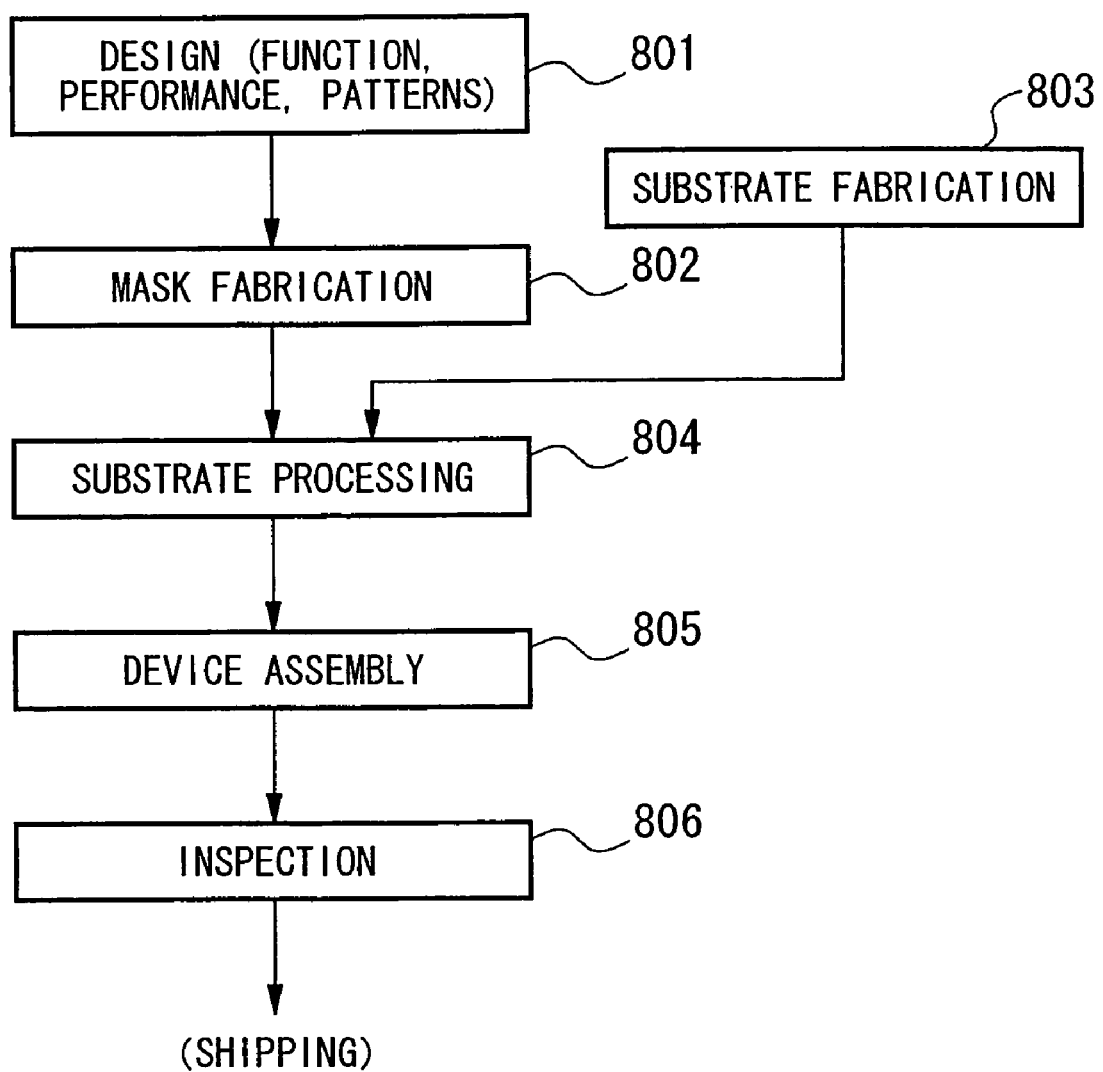
FIG. 15 is a flowchart showing an example of the manufacturing process for a semiconductor device.

Then, when the cam followers 658 and 663 pass by the clamp drive region A1, first the force that had been acting on the cam followers 663 is released and, as shown in FIG. 14D, the holding plate 665 returns to the horizontal condition, causing the hole part 665*a* to mate with the finger part 314 provided on the upper surface of the base part 610. Next, the force that had been acting on the cam followers 358 is also released and, by the spring force of the spring part 653 of the clamping spring part 650, the clamping spring part 650 is acted upon by a force that causes movement away form the reticle R. However, because the holding plate 665 of the follower part 660 linked to the clamping spring part 650 is mated with the finger part 614 of the base part 610, the movement of the clamping spring part 650 is restricted. Therefore the spring force of the spring part 653 of the clamping spring part 650 presses the pad part 620 firmly, so as to continue the pressure that firmly holds the reticle R.

Next, the operation when the pressure holding of the reticle R by the reticle clamp 600 is released is described below. The releasing operation, because it is the reverse of the pressure holding operation, will be described using FIG. 14.

First, as shown in FIG. 14C, a force is caused to act on the cam followers 658 and 663 with respect to the reticle clamp 600 (FIG. 14D). That is, this is the case in which the cam followers 658 and 663 enter the clamp drive region A1 and make contact with the protrusions 702*a*, 702*b*, 703*a*, and 703*b* of the cam member 700. By this occurring, the follower part 660 rotates about the pin part 662, the holding plate 665 is flipped up, and the mating with the base part 610 is released. Therefore, it becomes possible for the spring part 653 deformation to be released, the follower part 660 and the clamping spring part 650 become as one and move in the direction away from the reticle R.

Then, as shown in FIG. 14B, the holding plate 665 returns to the horizontal condition, and the point of action of the force on the cam followers 358 moves in the direction away from the reticle R. That is, this is the case in which only the cam followers 358 is in contact with the protrusions 702*a*, 702*b*, 703*a*, and 703*b* of the cam member 700. By this occurring, the follower part 660 and clamping spring part 650 become as one and move along the slide guide 640 in the right direction as shown in the drawing.

Accompanying the movement of the clamping spring part 650, the deformation of the spring mechanism incorporated within the mating part between the pin hole 621 and the pin part 621 is released, and the pad part 620 gradually rises.

Then, as shown in FIG. 14A, the reticle clamp 600 returns to the initial condition, and the pressure holding of the reticle R is released. Then, by the releasing of the vacuum chucking of the reticle R by the reticle holder 525, the reticle R can be removed from the stage part 520.

As described above, the reticle clamp 600 is different from the reticle clamp 300, in that, because there is no rubbing of the holding plate 665 with the inclined surface 614*a* of the finger part 614 when the hole part 665*a* of the holding plate 665 is caused to mate with the hole part 614*a*, and no rubbing of the holding plate 665 with the substantially perpendicular surface 614*b* of the finger part 614 when the mating is released, the pressing holding action and releasing action of the reticle clamp 600 are performed smoothly over long periods of time. That is, there are almost no problems caused by friction between the holding plate 665 and finger part 614.

Similar to the case of the reticle clamp 300, it is preferable to provide a detection apparatus in order to verify whether the pressure holding of the reticle R by the reticle clamp 600 has been released. For example, a reflective mirror is provided on the upper surface of the link part 652 and a laser interferometer is installed above the exposure region so that it does not interfere with the exposure operation. By measuring the X-direction position or Z-direction position of the link part 652 that passes beneath, it is possible to detection the operation condition of the reticle clamp 600. By doing this, because the reticle R is securely held on the reticle stage apparatus 500, it is possible to avoid problems caused by release of the reticle clamp 600 during exposure processing.

The operating sequence and shapes and combinations of the various constituent elements in the above-described embodiments are merely examples, and it is possible to make variations thereof, based on process condition and design requirements, within the scope of the spirit of the present invention. The present invention, for example, encompasses the following variations.

Although the foregoing description was for the case in which the loading region A2, in which the reticle R is loaded onto the reticle holder 211, 525, and the unloading region A3, in which the reticle R is unloaded from the reticle holder 525, coincide, there is no restriction in this regard. For example, it is possible to dispose the loading region A2 and the unloading region A3 at the two ends of the stroke of the reticle stage 200 and 500, and to dispose a cam member 400 at each of these regions.

Also, there is no restriction to having the elevator apparatus 410 or 710 raise and lower the cam member 400 or 700 to move it away from the loading region A2 or unloading region A3. For example, it is also possible to rotate the cam member 400 or 700 to move it away.

Also, it is possible when the stage part 203 or 520 passes by the cam member 400 or 700 and the reticle clamp 300 or 600 is opened and closed, to apply a limit to the speed of the stage part 203 or 520 as a consideration for protecting the reticle R.

Also, in the reticle stage apparatuses 200 and 500, there is no restriction to having the stators 205*a* and 542 move in the −Y direction in response to movement of the stage part 203 and 520 in the +Y direction, so that the repelling force accompanying the movement of stage parts 203 and 520 is cancelled out movement of the center of gravity is prevented. It is also possible to have a configuration in which an air pad is provided between the reticle stage apparatuses 203 and 520 and the column 201, so that the reticle table 202 or 510 moves in the −Y direction in response to movement of the stage part 203 or 520 in the +Y direction.

In these embodiments, the description is for the case in which pressure holding of the reticle R is done by the reticle clamps 300 and 600. There is, however, no such restriction, and it is also possible to hold the wafer W by pressure holding by a clamping apparatus (fixing apparatus). Also, it is possible to each of the reticle R and the wafer W using pressure holding.

Also, there is no restriction to the case in which the reticle clamps 300 and 600 press the upper surface of the reticle R, and it is also possible to press the end surfaces of the reticle R.

It is further possible to apply the present invention to a step-and-repeat type of exposure apparatus, in which exposure of the mask pattern is done with the mask and substrate in the static condition, the substrate being then successively moved.

It is further possible to apply the present invention to a proximity type of exposure apparatus, in which exposure of the mask pattern is done without using a projection optical system, by bringing the mask and substrate into intimate contact.

The present invention is not restriction to application in an exposure apparatus for the manufacture of semiconductor devices can be widely applied to exposure apparatuses, for example exposure apparatuses for exposing a liquid-crystal display element onto a square glass plate, and exposure apparatuses for the manufacturing of thin-film magnetic heads.

Also, the light source of an exposure apparatus to which the present invention is applied is not limited to a g line (436 nm), an i line (365 nm), a KrF excimer laser (248 nm), an ArF excimer laser (193 nm), or an $F_2$ laser (157 nm), and can alternatively be an X-ray or charged-particle beam such as an electron beam, or a thermionic emission type lanthanum hexaboride ($LaB_6$), or tantalum (Ta). Additionally, the magnification ratio of the projection optical system is not limited to a reducing system but can alternatively be a full-size or magnifying system.

In the case of using far infrared lines of an excimer laser or the like, it is possible to use a glass material through which far infrared passes, such as quartz or fluorite or the like as the projection optical system, in the case of using an $F_2$ laser or X-rays, it is possible to using a reflecting or refracting optical system (in which case a reflective type of reticle is also used), and in the case of using an electron beam, it is possible to use an electron optical system made up by an electron lens and deflectors as the projection optical system. Of course the optical path through which an electron beam passes must be a vacuum.

In the case in which linear motors are used in the wafer stage or reticle stage, it is possible to use either an air-floating type using air bearings or a magnetic floating type that uses either Lorentz force or reactance force. The stage can be a type that moves along guides or a guideless type for which guides are not provided. Additionally, in the case in which a flat motor is used as the stage drive apparatus, one of the magnet unit (permanent magnet) and the armature unit can be connected to stage, and the other of the magnet unit (permanent magnet) and the armature unit can be provided at the moving surface side (base) of the stage.

The repelling force by the movement of the wafer stage, as noted in Japanese Unexamined Patent Application, First Publication No. H08-166475 and the corresponding U.S. Pat. No. 6,281,654, can be configured so as to mechanically escape into the floor (ground), using a frame member. To the extent permitted by the laws of the countries specified (or selected countries) in this international patent application, the language of the above-described Japanese laid-open patent application publication and the corresponding U.S. patent are included herein by reference.

The repelling force by the movement of the reticle stage, as noted in Japanese Unexamined Patent Application, First Publication No. H08-330224 and the corresponding U.S. Pat. No. 6,683,433, can be configured so as to mechanically escape into the floor (ground), using a frame member. To the extent permitted by the laws of the countries specified (or selected countries) in this international patent application, the language of the above-described Japanese laid-open patent application publication and the corresponding US patent are included herein by reference.

The exposure apparatus to which the present invention is applied is manufactured by assembly of the various sub-systems, including those recited in the attached claims, so as to maintain the prescribed mechanical precision, electrical precision, and optical precision. In order to maintain this type of precision, before and after assembly adjustment is performed so that each optical system achieves optical precision, each mechanical system achieves mechanical precision, and each electrical system achieves electrical precision. The process of assembling the exposure apparatus from each sub-system includes mutual mechanical connections, electrical circuit wiring connections, and electrical circuit piping connections and the like between the various sub-systems. It will be understood, of course, that before the step of assembling the exposure apparatus from the various sub-systems are the steps of assembling the individual sub-systems. Once the process of assembling the various sub-systems into the exposure apparatus is completed, overall adjustment is performed, so as to achieve the various precisions as an overall exposure apparatus. Furthermore, it is desirable that the exposure apparatus be manufactured in a cleanroom with a controlled temperature and level of cleanness.

Microdevices such as semiconductor devices, are manufactured, as shown in FIG. 8, by such steps as the step 801 of designing the function and performance of the microdevice, step 802 of manufacturing a mask (reticle) based on the design step, step 803 of manufacturing a substrate of the device material, step 804 of exposing the substrate with the mask pattern, using an exposure apparatus as described above, step 805 of assembling the device (including dicing, bonding, and packaging steps), and the inspection step 806.

What is claimed is:

1. A fixation method for fixing a plate member to a movement member of a stage apparatus, the method comprising:
   placing the plate member on the movement member;
   moving the movement member while vacuum chucking a lower surface of the plate member; and
   when the movement member is moved to a prescribed position, bringing a fixing apparatus into contact with a surface of the plate member, which is different from the lower surface, to fix the plate member.

2. The fixation method for fixing the plate member according to claim 1, wherein the fixing apparatus fixes the plate member by the movement member moving to the prescribed position after moving from a placement region in which the plate member is placed and vacuum chucked on the movement member.

3. The fixation method for fixing the plate member according to claim 1, wherein the fixing apparatus fixing the plate member is released by the movement member moving to the prescribed position midway toward a removing area in which the plate member is removed from the movement member.

4. The fixation method for fixing the plate member according to claim 2, wherein the placement region and removing area are the same region.

5. An exposure method whereby a mask is fixed to a mask stage, a wafer is fixed to a wafer stage, and a pattern formed on the mask is exposed onto the substrate, wherein the fixation method according to claim 1 is used as at least one of the mask fixing method and substrate fixing method.

6. A method for producing a device, which includes a lithography step, wherein the exposure method according to claim 5 is used in the lithography step.

7. An exposure method in which a mask held on a mask stage is illuminated, and a pattern formed on the mask is exposed onto a substrate with a projection optical system, the method comprising:
   vacuum chucking a lower surface of the mask mounted on the mask stage; and
   while the mask stage moves from a first position for vacuum chucking the mask to a second position for illuminating the mask, contacting a fixing apparatus with a surface of the mask other than the lower surface so that the fixing apparatus fixes the mask.

8. An exposure method according to claim 7, wherein the fixing apparatus releases fixing of the mask while the mask stage moves toward a third position where the mask is removed from the mask stage.

9. An exposure method according to claim 8, wherein the first position conforms with the third position.

10. An exposure apparatus comprising:
- a mask stage on which a mask is held;
- a projection optical system via which a pattern of the mask is transferred onto a substrate when the mask is illuminated;
- a vacuum chucking apparatus by which a lower surface of the mask is mounted on the mask stage; and
- a fixing apparatus that, while the mask stage moves from a first position for vacuum chucking the mask to a second position for illuminating the mask, contacts a surface of the mask other than the lower surface to fix the mask.

11. A method of producing a device, which includes a lithography process, wherein an exposure apparatus according to claim 10 is used in the lithography process.

12. A method of producing a device, which includes a lithography process, wherein an exposure method according to claim 7 is used in the lithography process.

* * * * *

UNITED STATES PATENT AND TRADEMARK OFFICE
CERTIFICATE OF CORRECTION

| | |
|---|---|
| PATENT NO. | : 8,253,929 B2 |
| APPLICATION NO. | : 12/153772 |
| DATED | : August 28, 2012 |
| INVENTOR(S) | : Shibazaki |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 279 days.

Signed and Sealed this
Twenty-fifth Day of December, 2012

David J. Kappos
*Director of the United States Patent and Trademark Office*